United States Patent
Kuninobu et al.

(10) Patent No.: US 12,187,012 B2
(45) Date of Patent: Jan. 7, 2025

(54) LAMINATE, ELECTRONIC EQUIPMENT AND PRODUCTION METHOD FOR LAMINATE

(71) Applicant: JNC CORPORATION, Tokyo (JP)

(72) Inventors: Takafumi Kuninobu, Chiba (JP); Takeshi Fujiwara, Chiba (JP); Kento Ujiiye, Chiba (JP); Kazuhiro Takizawa, Chiba (JP)

(73) Assignee: JNC CORPORATION, Tokyo (JP)

( * ) Notice: Subject to any disclaimer, the term of this patent is extended or adjusted under 35 U.S.C. 154(b) by 1210 days.

(21) Appl. No.: 16/499,323

(22) PCT Filed: Mar. 29, 2018

(86) PCT No.: PCT/JP2018/013502
§ 371 (c)(1),
(2) Date: Sep. 29, 2019

(87) PCT Pub. No.: WO2018/181839
PCT Pub. Date: Oct. 4, 2018

(65) Prior Publication Data
US 2021/0101373 A1 Apr. 8, 2021

(30) Foreign Application Priority Data
Mar. 31, 2017 (JP) ................... 2017-072256

(51) Int. Cl.
*B32B 27/08* (2006.01)
*H01L 23/373* (2006.01)
*H05K 1/03* (2006.01)

(52) U.S. Cl.
CPC ............ *B32B 27/08* (2013.01); *H01L 23/373* (2013.01); *H05K 1/0373* (2013.01)

(58) Field of Classification Search
CPC ............................................. H05K 2201/0239
See application file for complete search history.

(56) References Cited

U.S. PATENT DOCUMENTS

2005/0019556 A1* 1/2005 Freeman .......... G06K 19/06009
428/458

FOREIGN PATENT DOCUMENTS

| JP | H0831985 | 2/1996 |
| JP | H10237228 | 9/1998 |

(Continued)

OTHER PUBLICATIONS

Machine translation of WO2015/170744A1 (Year: 2015).*

(Continued)

*Primary Examiner* — Ian A Rummel
(74) *Attorney, Agent, or Firm* — JCIPRNET

(57) ABSTRACT

The present application relates to a laminate between an inorganic substance and metal, which is excellent in thermal conductivity and interlayer adhesion. The laminate of the present application has a thermally conductive first inorganic filler bonded with one end of first coupling agent 11; and a metal layer bonded with one end of a third coupling agent, in which the other end of the third coupling agent is bonded with the other end of the first coupling agent. The laminate has such a bond between the inorganic filler and the metal layer through an organic compound, whereby the laminate may be excellent in thermal conductivity and interlayer adhesion.

24 Claims, 3 Drawing Sheets

(56) References Cited

FOREIGN PATENT DOCUMENTS

| | | | |
|---|---|---|---|
| JP | 2002270740 | 9/2002 | |
| JP | 2014156545 | 8/2014 | |
| JP | 2015503500 | 2/2015 | |
| WO | WO-2015170744 A1 * | 11/2015 | ............. C08G 59/20 |
| WO | 2016031888 | 3/2016 | |

OTHER PUBLICATIONS

"International Search Report (Form PCT/ISA/210) of PCT/JP2018/013502", mailed on Jul. 3, 2018, with English translation thereof, pp. 1-3.

* cited by examiner

LAMINATE, ELECTRONIC EQUIPMENT AND PRODUCTION METHOD FOR LAMINATE

CROSS-REFERENCE TO RELATED APPLICATION

This application is a 371 application of the international PCT application serial no. PCT/JP2018/013502, filed on Mar. 29, 2018, which claims the priority benefit of Japan application no. 2017-072256, filed on Mar. 31, 2017. The entirety of each of the above-mentioned patent applications is hereby incorporated by reference herein and made a part of this specification.

TECHNICAL FIELD

The invention relates to a laminate. In particular, the invention relates to a laminate in which heat generated inside electronic equipment can be efficiently conducted and transferred, whereby heat can be dissipated, and the laminate may be formed into an electronic circuit board or the like.

BACKGROUND ART

In recent years, in a semiconductor device for controlling power in a hybrid vehicle, or an electric vehicle, or in a CPU for a high speed computer, or the like, achievement of high thermal conduction in a package material has been desired to avoid an excessive increase in a temperature of a semiconductor thereinside. More specifically, capability of effectively dissipating heat generated from a semiconductor chip to an outside has become important. Moreover, a rise of operation temperature causes a thermal strain due to a difference in a thermal expansion coefficient between materials used in a package, which causes a problem of reduction of a service life by peeling off of wiring, delamination of a multilayer substrate or the like.

Specific examples of a method for solving such an issue of heat dissipation include a method for dissipating heat by bringing a high thermal conductive material (heat-dissipating member) into contact with a heat generation site to lead heat to an outside. Patent literature No. 1 discloses a heat-dissipating member prepared by composite formation between an organic material and an inorganic material, in which the inorganic materials are connected with each other by a coupling agent and a polymerizable liquid crystal compound (paragraph 0007, FIGS. 1 and, 2). The inorganic materials are connected with the coupling agent and the polymerizable liquid crystal compound, whereby thermal conductivity between the inorganic materials can be significantly enhanced.

Patent literature No. 2 discloses a method of connecting a metal layer formed of aluminum or aluminum alloy by DCB bonding on a ceramic layer which consists essentially of aluminum nitride obtained by sintering at a temperature between 1,600° C. to 1,900° C. through an intermediate layer consisting essentially of aluminum oxide (claim 1, paragraphs 0018 to 0021). Connection performance is improved by the method.

CITATION LIST

Patent Literature

Patent literature No. 1: WO 2016/031888 A.
Patent literature No. 2: JP 2015-503500 A.

SUMMARY OF INVENTION

Technical Problem

However, a material or the like used in a package is required to have higher thermal conductivity or higher interlayer adhesion. Moreover, as a production method, an easier method is required.

Accordingly, the invention provides a laminate between an inorganic substance and metal, and the laminate excellent in thermal conductivity and interlayer adhesion, and a production method for the laminate according to which the laminate can be produced in an easier manner in fewer steps.

Solution to Problem

The present inventors have found that a laminate having an inorganic filler layer and a metal layer can be easily formed by such a form as connecting inorganic materials with each other by using an organic material in composite formation of the organic material and the inorganic material, namely, connecting a layer to be formed of an inorganic filler and the metal layer through a coupling agent, a bifunctional or higher functional polymerizable compound, or the like, and that the laminate having a bond between the inorganic filler layer and the metal layer is excellent in interlayer adhesion, and may have significantly high thermal conductivity, and the present inventors have completed the invention.

A laminate related to a first aspect of the invention has thermally conductive first inorganic filler 1 bonded with one end of first coupling agent 11; and metal layer 5 bonded with one end of third coupling agent 15, wherein the other end of third coupling agent 15 is bonded with the other end of first coupling agent 11, as shown in FIG. 2, for example.

The term "one end" and the term "other end" only need to be an edge or an end in a shape of a molecule, and may be or need not be both ends of a long side of the molecule. The term "metal layer" may be a layer of a shape according to which the layer made of the inorganic filler can be laminated on metal, and may be plate-like or rod-like, for example.

If the laminate is thus configured, the laminate can be formed by bonding the inorganic filler with the metal layer through the coupling agent/the coupling agent. Therefore, a phonon, which is a main element of thermal conduction, can be directly propagated between the inorganic filler and the metal layer, and the laminate can have significantly high thermal conductivity not only in a horizontal direction but also in a thickness direction. The term "phonon" means lattice vibration of atoms in a solid. Further, an interlayer of the laminate is also excellent in interlayer adhesion by the bond.

A laminate related to a second aspect of the invention has thermally conductive second inorganic filler 2 bonded with one end of second coupling agent 12, in which bifunctional or higher functional polymerizable compound 22 is further bonded with the other end of second coupling agent 12; and metal layer 5 bonded with one end of third coupling agent 15, wherein the other end of third coupling agent 15 is bonded with at least one functional group of polymerizable compound 22, as shown in FIG. 3, for example.

If the laminate is thus configured, the laminate can be formed by bonding the inorganic filler and the metal layer through the coupling agent/the polymerizable compound/the coupling agent. Therefore, the phonon, which is the main element of thermal conduction, can be directly propagated between the inorganic filler and the metal layer, and the laminate can have significantly high thermal conductivity not only in the horizontal direction but also in the thickness direction. Further, the interlayer of the laminate is also excellent in interlayer adhesion by the bond.

A laminate related to a third aspect of the invention has thermally conductive third inorganic filler 3 having a functional group on a surface; and metal layer 5 bonded with one end of third coupling agent 15, wherein the other end of third coupling agent 15 is bonded with the functional group of third inorganic filler 3, as shown in FIG. 4, for example.

If the laminate is thus configured, the laminate can be formed by bonding the inorganic filler having the functional group on the surface of a particle, and the metal layer through the coupling agent. Therefore, the phonon, which is the main element of thermal conduction, can be directly propagated between the inorganic filler and the metal layer, and the laminate can have significantly high thermal conductivity not only in the horizontal direction but also in the thickness direction. Further, the laminate is also excellent in interlayer adhesion by the bond.

A laminate related to a fourth aspect according to any one of the first aspect to the third aspect of the invention further has: in thermally conductive first inorganic filler 1 bonded with one end of first coupling agent 11 and thermally conductive second inorganic filler 2 bonded with one end of second coupling agent 12, in which bifunctional or higher functional polymerizable compound 22 is further bonded with the other end of second coupling agent 12, a filler bonded with at least one functional group of polymerizable compound 22 in the other end of first coupling agent 11, as shown in FIG. 5, for example.

If the laminate is thus configured, a site between the inorganic fillers has the bond through the coupling agent/the polymerizable compound/the coupling agent. Therefore, the phonon, which is the main element of thermal conduction, can be directly propagated between the inorganic fillers, and the inorganic filler layer can have significantly high thermal conductivity not only in the horizontal direction but also in the thickness direction.

A laminate related to a fifth aspect according to the fourth aspect of the invention, wherein the first coupling agent, the second coupling agent or the third coupling agent is a silane coupling agent having basicity.

If the laminate is thus configured, the coupling agent can be strongly bonded with the inorganic filler or the metal.

A laminate related to a sixth aspect according to the fifth aspect of the invention, wherein the first coupling agent, the second coupling agent or the third coupling agent is a silane coupling agent having an amino group, an oxiranyl group or an oxetanyl group.

If the laminate is thus configured, the amino group has high reactivity with the inorganic filler, and the oxiranyl group or the oxetanyl group can form a strong bond with the polymerizable compound having the amino group.

A laminate related to a seventh aspect according to any one of the first aspect to the sixth aspect of the invention further has a thermally conductive fourth inorganic filler.

If the laminate is thus configured, the fourth inorganic filler can fill gaps among the first inorganic filler and the third inorganic filler, or in the case of the plate-like filler, can adjust alignability, and can contribute to thermal conductivity of a layer of inorganic filler.

A laminate related to an eighth aspect according to the seventh aspect of the invention, wherein the first inorganic filler, the second inorganic filler, the third inorganic filler or the fourth inorganic filler each is at least one selected from boron nitride, boron carbide, carbon boron nitride, graphite, a carbon fiber, a carbon nanotube, graphene, alumina, aluminum nitride, silica, silicon nitride, silicon carbide, zinc oxide, magnesium oxide, magnesium hydroxide, cordierite or an iron oxide-based material.

If the laminate is thus configured, the inorganic filler has high thermal conductivity, and therefore a thermal expansion coefficient can be arbitrarily changed depending on kinds of an inorganic material and an organic material contained therein, a blending ratio, curing conditions and the like. Accordingly, the thermal expansion coefficient can be adjusted to a thermal expansion coefficient similar to a level of the metal layer, and delamination caused by a difference in the thermal expansion coefficient can be suppressed.

A laminate related to a ninth aspect according to any one of the first aspect to the eighth aspect of the invention, wherein each layer and the next layer of the laminate are laminated in a thickness direction or in a horizontal direction, as shown in FIG. 6, for example.

If the laminate is thus configured, strain caused by the difference in the thermal expansion coefficient can be relaxed not only in the thickness direction but also in the horizontal direction. Further thermal conductivity in the vertical direction can also be further increased by vertically arranging the laminates having high thermal conductivity in the horizontal direction.

Electronic equipment related to a tenth aspect of the invention has the laminate according to any one of the first aspect to the ninth aspect of the invention and an electronic device having a heat generation unit, wherein the laminates are arranged to the electronic device so as to be in contact with the heat generation unit.

If the electronic equipment is thus configured, heat generated in the electronic device can be efficiently conducted by the laminate having high thermal conductivity. Moreover, a device in which the laminates are hard to peel off by a heat cycle can be prepared by bringing a thermal expansion coefficient in a planer direction closer to a thermal expansion coefficient of copper wiring, a semiconductor element such as silicon and silicon nitride, which is attached to the laminate.

A production method for a laminate related to an eleventh aspect of the invention has a step of bonding thermally conductive first inorganic filler 1 with one end of first coupling agent 11; a step of bonding metal layer 5 with one end of third coupling agent 15; and a step of bonding the other end of third coupling agent 15 with the other end of first coupling agent 11, as shown in FIG. 2, for example.

If the production method is thus configured, the laminate in which the inorganic filler and the metal layer are bonded through the coupling agent/the coupling agent can be formed.

A production method for a laminate related to a twelfth aspect of the invention has a step of bonding thermally conductive second inorganic filler 2 with one end of second coupling agent 12; a step of bonding the other end of second coupling agent 12 to bifunctional or higher functional polymerizable compound 22; a step of bonding metal layer 5 with one end of third coupling agent 15; and a step of bonding the other end of third coupling agent 15 with at least one functional group of polymerizable compound 22, as shown in FIG. 3, for example.

If the production method is thus configured, the laminate in which the inorganic filler and the metal layer are bonded through the coupling agent/the polymerizable compound/the coupling agent can be formed.

A production method for a laminate related to a thirteenth aspect of the invention has a step of bonding metal layer 5 with one end of third coupling agent 15; and a step of bonding the other end of third coupling agent 15 with a functional group of thermally conductive third inorganic filler 3 having a functional group on a surface, as shown in FIG. 4, for example.

If the production method is thus configured, the laminate in which the inorganic filler having the functional group on the surface of the particle, and the metal layer are bonded through the coupling agent can be formed.

The production method for the laminate related to a fourteenth aspect according to any one of the eleventh aspect to the thirteenth aspect of the invention further has: in thermally conductive first inorganic filler 1 bonded with one end of first coupling agent 11 and thermally conductive second inorganic filler 2 bonded with one end of second coupling agent 12, in which bifunctional or higher functional polymerizable compound 22 is further bonded with the other end of second coupling agent 12, a filler bonded with at least one functional group of polymerizable compound 22 in the other end of first coupling agent 11, as shown in FIG. 5, for example.

If the production method is thus configured, the laminate in which a site between the inorganic fillers is bonded through the coupling agent/the polymerizable compound/the coupling agent can be formed.

Advantageous Effects of Invention

A laminate of the invention is configured of a layer formed of inorganic filler, and a metal layer, in which the laminate has significantly high thermal conductivity and excellent interlayer adhesion. Further, the laminate has excellent characteristics such as chemical stability, hardness and mechanical strength. The laminate is suitable for a heat-dissipating substrate, a heat-dissipating plate (planar heat sink), a heat-dissipating sheet, a heat-dissipating coating film, a heat-dissipating adhesive, a heat-dissipating insulation substrate with an electrode and a thermally conductive electronic circuit board, for example. Further, in a production method for the laminate according to the invention, the laminate between the inorganic filler and metal can be produced in an easier manner with fewer steps.

DESCRIPTION OF EMBODIMENTS

Figure 1:
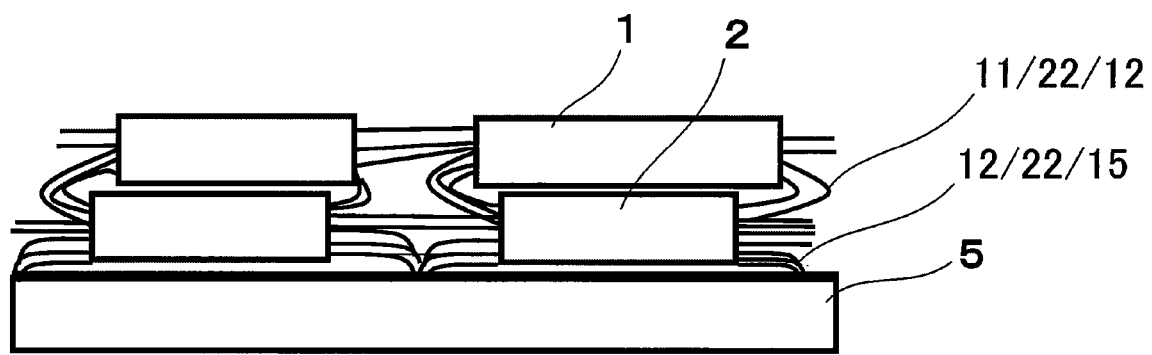
FIG. 1 is a conceptual diagram showing a bond between an inorganic filler and metal, and a bond between inorganic fillers by taking boron nitride being a plate-like filler as an example in a laminate of the present application. Boron nitride is aligned in a crosswise direction by a pressure press.

The present application is based on Japanese Patent Application No. 2017-072256 filed on Mar. 31, 2017 in Japan, and is hereby incorporated by reference in its entirety in the present application. The invention may be further completely understood by the detailed description described below. A further application scope of the invention will become apparent by the detailed description described below. However, the detailed description and a specific Example are desirable embodiments of the invention, and described only for illustrative purposes because various possible changes and modifications will be apparent to those having ordinary skill in the art on the basis of the detailed description within spirit and the scope of the invention. The applicant has no intention to dedicate to the public any described embodiment, and among the modifications and alternatives, those which may not literally fall within the scope of the present claims constitute a part of the invention in the sense of the doctrine of equivalents.

Hereinafter, an embodiment of the invention will be described with reference to drawings. In addition, in each Figure, an identical or similar sign is placed on a part identical or corresponding to each other, and overlapped description is omitted. Moreover, the invention is not limited by the embodiments described below.

Usage of terms herein is as described below.

"Liquid crystal compound" or "compound having liquid crystallinity" is a compound that develops a liquid crystal phase such as a nematic phase and a smectic phase.

Meaning of the phrase such as "arbitrary —$CH_2$— in alkyl may be replaced by —O— or the like" or "arbitrary —$CH_2CH_2$— may be replaced by —CH=CH— or the like" is shown in one example below. Specific examples of a group in which arbitrary —$CH_2$— in $C_4H_9$— is replaced by —O— or —CH=CH— include $C_3H_7O$—, $CH_3$—O—$(CH_2)_2$— and $CH_3$—O—$CH_2$—O—. In a similar manner, specific examples of a group in which arbitrary —$CH_2CH_2$— in $C_5H_{11}$— is replaced by —CH=CH— include $H_2C$=CH—$(CH_2)_3$— and $CH_3$—CH=CH—$(CH_2)_2$—, and further specific examples of a group in which arbitrary —$CH_2$— is replaced by —O— include $CH_3$—CH=CH—$CH_2$—O—. Thus, the term "arbitrary" means "at least one selected without differentiation." In addition, in consideration of stability of a compound, $CH_3$—O—$CH_2$—O— in which no oxygen is adjacent to oxygen is preferred to $CH_3$—O—O—$CH_2$— in which oxygen is adjacent to oxygen.

Moreover, with regard to ring A, the phrase "arbitrary hydrogen may be replaced by halogen, alkyl having 1 to 10 carbons or alkyl halide having 1 to 10 carbons" means an aspect of a case where at least one hydrogen in 2, 3, 5 and 6 positions of 1,4-phenylene is replaced by a substituent such as fluorine and a methyl group, for example, and specific examples of an aspect of a case where a substituent is "alkyl halide having 1 to 10 carbons" include 2-fluoroethyl and 3-fluoro-5-chlorohexyl.

"Compound (1-1)" means a liquid crystal compound represented by the following formula (1-1) described later or at least one kind of compound represented by the following formula (1-1) in several cases. "Composition for a heat-dissipating member" means a composition containing at least one kind of compound selected from compound (1-1) described above or other polymerizable compounds. When one compound (1-1) has a plurality of 'A', two of arbitrary 'A' may be identical to or different from each other. When a plurality of compounds (1-1) have 'A', two of arbitrary 'A' may be identical to or different from each other. A same rule applies also to other symbols such as $R^a$ and Z and a group or the like.

Laminate

A laminate according to a first embodiment of the invention has a layer including any of inorganic fillers 1, 2 and 3, and metal layer 5. A site between the inorganic fillers also has a bond through a coupling agent and a polymerizable compound, and a site between the inorganic filler and the metal layer has the bond through the coupling agent and the polymerizable compound in a similar manner. The laminate described above can be obtained by performing compression molding on the composition for the heat-dissipating member, containing the inorganic filler, and the metal layer treated with the coupling agent. For example, as shown in FIG. 1, first inorganic filler 1 is bonded with a second inorganic filler through first coupling agent 11/polymerizable compound 22/second coupling agent 12 (see FIG. 5) to form a layer of inorganic filler. The second inorganic filler is bonded with metal layer 5 through second coupling agent 12/polymerizable compound 22/third coupling agent 15 (see FIG. 3).

A bond between an inorganic filler and a metal layer will be described with reference to FIG. 2. The composition for the heat-dissipating member contains at least thermally conductive first inorganic filler 1 bonded with one end of first coupling agent 11. If compression molding is performed on the composition for the heat-dissipating member and metal layer 5 treated with third coupling agent 15, the other end of third coupling agent 15 bonded with metal layer 5 is bonded with the other end of first coupling agent 11 to form the bond between the inorganic filler and the metal layer. Thus, a laminate by a layer of inorganic filler 1 and metal layer 5 is formed.

As another aspect, a bond between an inorganic filler and a metal layer will be described with reference to FIG. 3. The composition for the heat-dissipating member contains at least thermally conductive second inorganic filler 2 bonded with one end of second coupling agent 12, in which bifunctional or higher functional polymerizable compound 22 is further bonded with the other end of second coupling agent 12. If compression molding is performed on the composition for the heat-dissipating member and metal layer 5 treated with third coupling agent 15, the other end of third coupling agent 15 bonded with metal layer 5 is bonded with at least one functional group of polymerizable compound 22 to form the bond between the inorganic filler and the metal layer. Thus, a laminate by a layer of inorganic filler 2 and metal layer 5 is formed.

As another aspect, a bond between an inorganic filler and a metal layer will be described with reference to FIG. 4. The composition for the heat-dissipating member contains at least thermally conductive third inorganic filler 3 having a functional group on a surface thereof. If compression molding is performed on the composition for the heat-dissipating member and metal layer 5 treated with third coupling agent 15, the other end of third coupling agent 15 bonded with metal layer 5 is bonded with the functional group of third inorganic filler 3 to form the bond between the inorganic filler and the metal layer. Thus, a laminate by a layer of inorganic filler 3 and metal layer 5 is formed.

Figure 5:
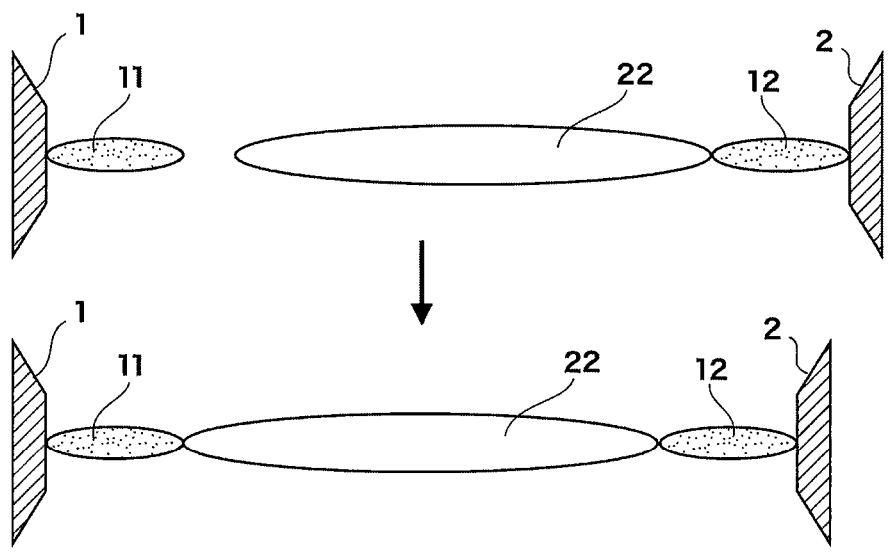
FIG. 5 is a conceptual diagram showing bonding of the other end of first coupling agent 11 bonded with first inorganic filler 1 with polymerizable compound 22 of second inorganic filler 2 by compression molding of a composition for a heat-dissipating member.

A bond between inorganic fillers will be described with reference to FIG. 5. When the composition for the heat-dissipating member contains thermally conductive first inorganic filler 1 bonded with one end of first coupling agent 11 and thermally conductive second inorganic filler 2 bonded with one end of second coupling agent 12, in which bifunctional or higher functional polymerizable compound 22 is further bonded with the other end of second coupling agent 12, if compression molding is performed on the composition for the heat-dissipating member, the other end of first coupling agent 11 is bonded with at least one function group of polymerizable compound 22 to form the bond between the inorganic fillers.

As described above, the laminate of the present invention is formed of a filler layer of the inorganic filler contained in the composition for the heat-dissipating member, and the metal layer treated with the coupling agent.

As one aspect, the composition for the heat-dissipating member can contain thermally conductive first inorganic filler 1 bonded with one end of first coupling agent 11.

Alternatively, the composition for the heat-dissipating member can contain thermally conductive second inorganic filler 2 bonded with one end of second coupling agent 12, in which bifunctional or higher functional polymerizable compound 22 is further bonded with the other end of second coupling agent 12.

Alternatively, the composition for the heat-dissipating member can contain a thermally conductive third inorganic filler having a functional group on the surface of a particle.

Alternatively, the composition for the heat-dissipating member can contain the first inorganic filler and the second inorganic filler described above.

Alternatively, the composition for the heat-dissipating member can contain the first inorganic filler and the third inorganic filler described above.

Alternatively, the composition for the heat-dissipating member can contain the second inorganic filler and the third inorganic filler described above.

Alternatively, the composition for the heat-dissipating member can contain the first inorganic filler, the second inorganic filler and the third inorganic filler described above.

Alternatively, the composition for the heat-dissipating member can further contain a fourth inorganic filler different from the first inorganic filler, the second inorganic filler and the third inorganic filler in characteristics such as a shape and thermal conductivity.

For example, the laminate of the invention is formed by performing compression molding after applying the composition for the heat-dissipating member, containing first inorganic filler 1 bonded with a plurality of first coupling agents 11 and second inorganic filler 2 bonded with a plurality of bifunctional or higher functional polymerizable compounds 22 and second coupling agent 12 on metal layer 5 bonded with a plurality of third coupling agents 15. Alternatively, the laminate of present invention may be obtained by performing compression molding after applying the composition for the heat-dissipating member, containing second inorganic filler 2 bonded with a plurality of bifunctional or higher functional polymerizable compounds 22 and second coupling agents 12 on metal layer 5 bonded with a plurality of third coupling agents 15, without containing first inorganic filler 1 bonded with first coupling agent 11 in the composition for the heat-dissipating member.

Composition for Heat-Dissipating Member

The composition for the heat-dissipating member contains at least one of the first inorganic filler, the second inorganic filler and the third organic filler described above. The composition for the heat-dissipating member, containing any of the first inorganic filler, the second inorganic filler and the third inorganic filler described above, can form the bond with the metal layer subjected to coupling treatment, and such a case is preferred.

In addition, the composition for the heat-dissipating member may contain a combination of inorganic fillers capable of forming the bond between the inorganic fillers. For example, when the composition for the heat-dissipating member contains the first inorganic filler bonded with the first coupling agent, and the second inorganic filler bonded with the bifunctional or higher functional polymerizable compound and the second coupling agent, if the composition for the heat-dissipating member is cured, the inorganic fillers can be bonded with each other through the coupling agent and the polymerizable compound. FIG. 1 shows an example when boron nitride is used as an inorganic filler. When boron nitride (h-BN) is treated with the coupling agent, boron nitride has a small amount of reactive group on a plane of particles, and therefore a relatively large amount of coupling agent is bonded around a side surface. The boron nitride treated with the coupling agent can form a bond with the polymerizable compound. Accordingly, as shown in FIG. 5, boron nitride can be bonded with each other by bonding the other end of coupling agent 11 of boron nitride 1 subjected to coupling treatment, with the other end of polymerizable compound 22 of boron nitride 2 subjected to coupling treatment and further subjected to modification with the polymerizable compound.

As described above, a phonon can be directly propagated by bonding the inorganic fillers with each other through the coupling agent and the polymerizable compound, and therefore a cured material has significantly high thermal conductivity, whereby an organic-inorganic composite material in which the thermal expansion coefficient of an inorganic component is directly reflected can be prepared.

Realization of such a bond between the inorganic fillers is important in the invention. Thus, coupling agent 12 and polymerizable compound 22 may be bonded in advance by using an organic synthesis technology, and then coupling agent 12 may be bonded with the second inorganic filler.

Bifunctional or Higher Functional Polymerizable Compound

As the bifunctional or higher functional polymerizable compound to be bonded with the second coupling agent, a bifunctional or higher functional polymerizable liquid crystal compound (hereinafter, referred to merely as "polymerizable liquid crystal compound" in several cases) is preferably used.

As the polymerizable liquid crystal compound, the liquid crystal compound represented by the following formula (1-1) is preferred, in which the compound has a liquid crystal skeleton and a polymerizable group, and has high polymerization reactivity, a wide range of a liquid crystal phase temperature, excellent miscibility and the like. Compound (1-1) described above is easily uniformized when the compound (1-1) is mixed with other liquid crystal compounds, polymerizable compounds or the like.

$$R^a\text{—}Z\text{-}(A\text{-}Z)_m\text{—}R^a \quad (1\text{-}1)$$

in which m is an integer from 1 to 6, preferably an integer from 2 to 6, and further preferably an integer from 2 to 4.

Physical properties such as a liquid crystal phase-exhibiting region can be arbitrarily adjusted by suitably selecting terminal group $R^a$, ring structure A and bonding group Z in compound (1-1) described above. An effect of a kind of terminal group $R^a$, ring structure A and bonding group Z on the physical properties of compound (1-1) and a preferred example thereof will be described below.

Terminal Group $R^a$

Terminal group $R^a$ only needs to be each independently a functional group having a capability of bonding with a functional group at the other end of the first coupling agent and the second coupling agent.

Specific examples thereof include polymerizable groups represented by the following formulas (2-1) and (2-2), cyclohexene oxide, phthalic anhydride or succinic anhydride, but are not limited thereto.

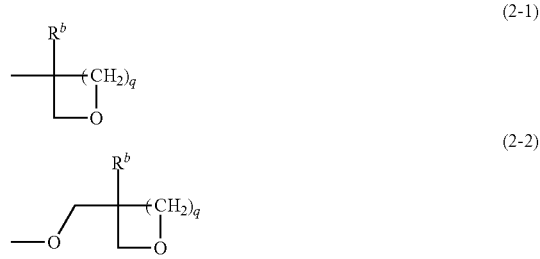

In formulas (2-1) to (2-2), $R^b$ is hydrogen, halogen, —$CF_3$ or alkyl having 1 to 5 carbons, and q is 0 or 1.

Further, specific examples of a combination of functional groups forming a bond between terminal group $R^a$ and the coupling agent include a combination of oxiranyl and amino, a combination of oxetanyl and amino, a combination of vinyl and vinyl, a combination of methacryloxy and methacryloxy, a combination of carboxy or a carboxylic anhydride residue and amino, a combination of imidazole and oxiranyl and a combination of imidazole and oxetanyl, but are not limited thereto. A combination having high heat resistance is further preferred.

Ring Structure A

When at least one ring in ring structure A of compound (1-1) described above is 1,4-phenylene, an orientational order parameter and magnetic anisotropy are large. Moreover, when at least two rings are 1,4-phenylene, a temperature range of the liquid crystal phase is wide and further a clearing point is high. When at least one hydrogen on a 1,4-phenylene ring is replaced by cyano, halogen, —$CF_3$ or —$OCF_3$, dielectric anisotropy is high. Moreover, when at least two rings are 1,4-cyclohexylene, the clearing point is high and viscosity is small.

Specific examples of preferred A include 1,4-cyclohexylene, 1,4-cyclohexenylene, 2,2-difluoro-1,4-cyclohexylene, 1,3-dioxane-2,5-diyl, 1,4-phenylene, 2-fluoro-1,4-phenylene, 2,3-difluoro-1,4-phenylene, 2,5-difluoro-1,4-phenylene, 2,6-difluoro-1,4-phenylene, 2,3,5-trifluoro-1,4-phenylene, pyridine-2,5-diyl, 3-fluoropyridine-2,5-diyl, pyrimidine-2,5-diyl, pyridazine-3,6-diyl, naphthalene-2,6-diyl, tetrahydronaphthalene-2,6-diyl, fluorene-2,7-diyl, 9-methylfluorene-2,7-diyl, 9,9-dimethylfluorene-2,7-diyl, 9-ethylfluorene-2,7-diyl, 9-fluorofluorene-2,7-diyl and 9,9-difluorofluorene-2,7-diyl.

With regard to a configuration of 1,4-cyclohexylene and 1,3-dioxane-2,5-diyl, trans is preferred to cis. The latter is not illustrated because 2-fluoro-1,4-phenylene and 3-fluoro-1,4-phenylene are structurally identical to each other. A same rule also applies to a relationship between 2,5-difluoro-1,4-phenylene and 3,6-difluoro-1,4-phenylene, or the like.

Specific examples of further preferred A include 1,4-cyclohexylene, 1,4-cyclohexenylene, 1,3-dioxane-2,5-diyl, 1,4-phenylene, 2-fluoro-1,4-phenylene, 2,3-difluoro-1,4-phenylene, 2,5-difluoro-1,4-phenylene and 2,6-difluoro-1,4-phenylene. Particularly preferred A is 1,4-cyclohexylene and 1,4-phenylene.

Bonding Group Z

When bonding group Z of compound (1-1) described above is a single bond, —(CH$_2$)$_2$—, —CH$_2$O—, —OCH$_2$—, —CF$_2$O—, —OCF$_2$—, —CH═CH—, —CF═CF— or —(CH$_2$)$_4$—, particularly, a single bond, —(CH$_2$)$_2$—, —CF$_2$O—, —OCF$_2$—, —CH═CH— or —(CH$_2$)$_4$—, viscosity decreases. Moreover, when bonding group Z is —CH═CH—, —CH═N—, —N═CH—, —N═N— or —CF═CF—, the temperature range of the liquid crystal phase is wide. When bonding group Z is alkyl having about 4 to about 10 carbons, a melting point decreases.

Specific examples of preferred Z include a single bond, —(CH$_2$)$_2$—, —(CF$_2$)$_2$—, —COO—, —CCC—, —CH$_2$O—, —OCH$_2$—, —CF$_2$O—, —OCF$_2$—, —CH═CH—, —CF═CF—, —C≡C—, —(CH$_2$)$_4$—, —(CH$_2$)$_3$O—, —O(CH$_2$)$_3$—, —(CH$_2$)$_2$COO—, —OCO(CH$_2$)$_2$—, —CH═CH—COO— and —OCO—CH═CH—.

Specific examples of further preferred Z include a single bond, —(CH$_2$)$_2$—, —COO—, —OCO—, —CH$_2$O—, —OCH$_2$—, —CF$_2$O—, —OCF$_2$—, —CH═CH— and —C≡C—. Examples of particularly preferred Z include a single bond, —(CH$_2$)$_2$—, —COO— or —OCO—.

As the compound (1-1) has a larger number of rings, the compound (1-1) becomes harder to be softened at a high temperature, and therefore the compound (1-1) is preferred as a heat-dissipating material. However, if a softening temperature becomes higher than a polymerization temperature, molding becomes difficult, and therefore both are preferably balanced according to a purpose. In addition, in the present description, a 6-membered ring and a fused ring containing the 6-membered ring and the like are basically deemed as a ring, and a 3-membered ring, a 4-membered ring or a 5-membered ring alone is not deemed as the ring, for example. Moreover, a fused ring such as a naphthalene ring and a fluorene ring is deemed as one ring.

Compound (1-1) described above may be optically active or optically inactive. When compound (1-1) is optically active, the compound (1-1) has asymmetric carbon or axial asymmetry in several cases. With regard to a configuration of the asymmetric carbon, the compound (1-1) may have R or S. The asymmetric carbon may be positioned in either R$^a$ or A, and if the compound (1-1) has the asymmetric carbon, compatibility of compound (1-1) is satisfactory. When compound (1-1) has the axial asymmetry, twist induction force is large. Moreover, compound (1-1) may have any kind of optical rotation.

As described above, a compound having target physical properties can be obtained by appropriately selecting a kind of terminal group R$^a$, ring structure A and bonding group Z, and the number of rings.

Compound (1-1)

Compound (1-1) can also be represented as the following formula (1-a) or (1-b).

(1-a)

(1-b)

In formulas (1-a) and (1-b) described above, A, Z and R$^a$ have the same definitions as A, Z and R$^a$ defined in the above formula (1-1), and P represents a polymerizable group represented by the following formulas (2-1) to (2-2), cyclohexene oxide, phthalic anhydride or succinic anhydride, and Y represents a single bond or alkylene having 1 to 20 carbon, preferably alkylene having 1 to 10 carbons, and in the alkylene, arbitrary —CH$_2$— may be replaced by —O—, —S—, —CO—, —COO—, —OCO— or —CH═CH—. Particularly preferred Y is alkylene in which —CH$_2$— at one end or both ends of alkylene having 1 to 10 carbons is replaced by —O—. Then, m is an integer from 1 to 6, preferably an integer from 2 to 6, and further preferably an integer from 2 to 4.

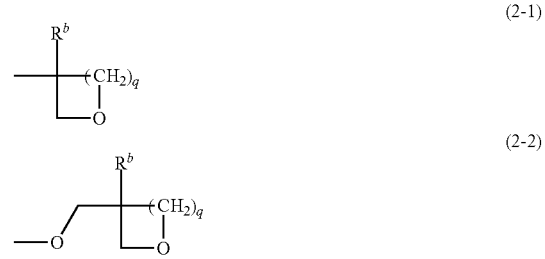

In formulas (2-1) to (2-2), R$^b$ is hydrogen, halogen, —CF$_3$ or alkyl having 1 to 5 carbons, and q is 0 or 1.

Specific examples of preferred compound (1-1) include compounds (a-1) to (a-10), (b-1) to (b-16), (c-1) to (c-16), (d-1) to (d-15), (e-1) to (e-15), (f-1) to (f-14) and (g-1) to (g-20) described below. In addition, an asterisk mark (*) in the formulas represents asymmetric carbon.

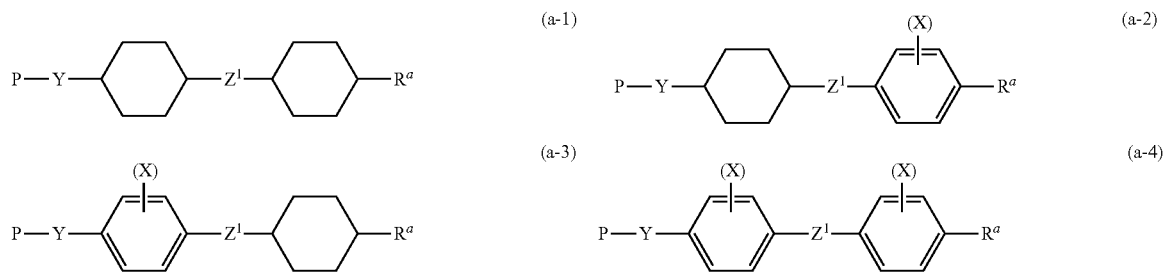

-continued
(a-5) 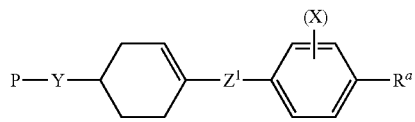
(a-6) 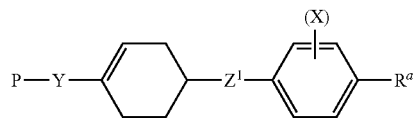
(a-7) 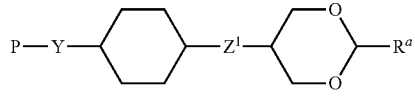
(a-8) 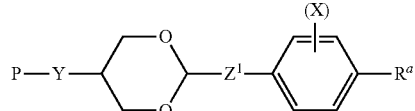
(a-9) 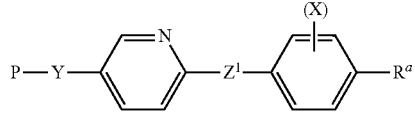
(a-10) 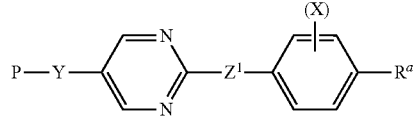
(b-1) 
(b-2) 
(b-3) 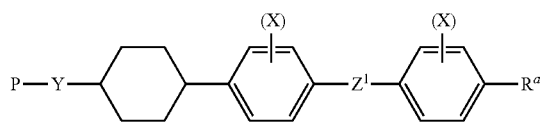
(b-4) 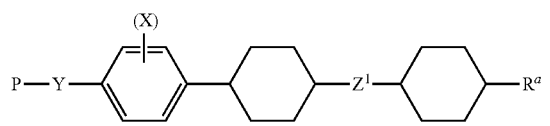
(b-5) 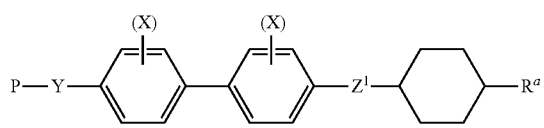
(b-6) 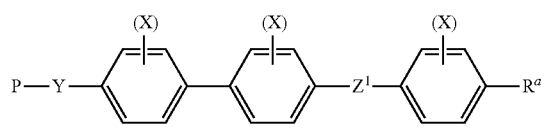
(b-7) 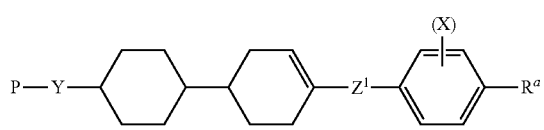
(b-8) 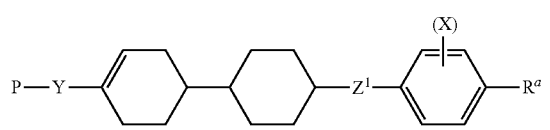
(b-9) 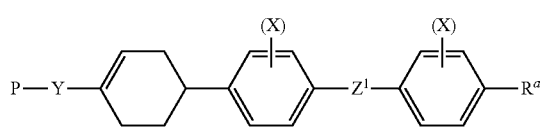
(b-10) 
(b-11) 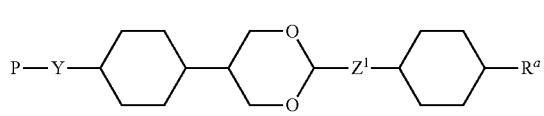
(b-12) 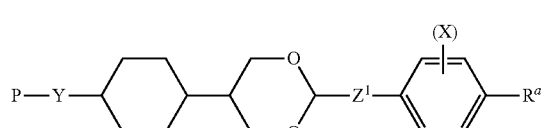
(b-13) 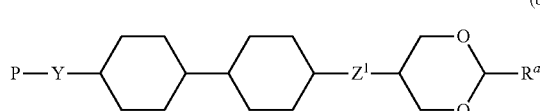
(b-14) 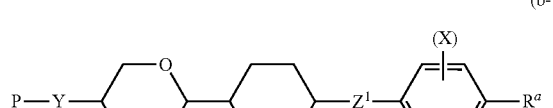
(b-15) 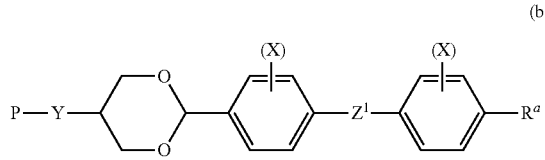
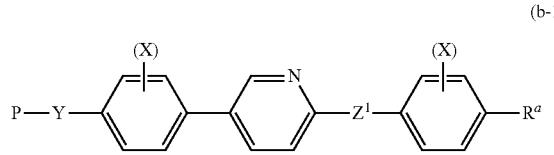

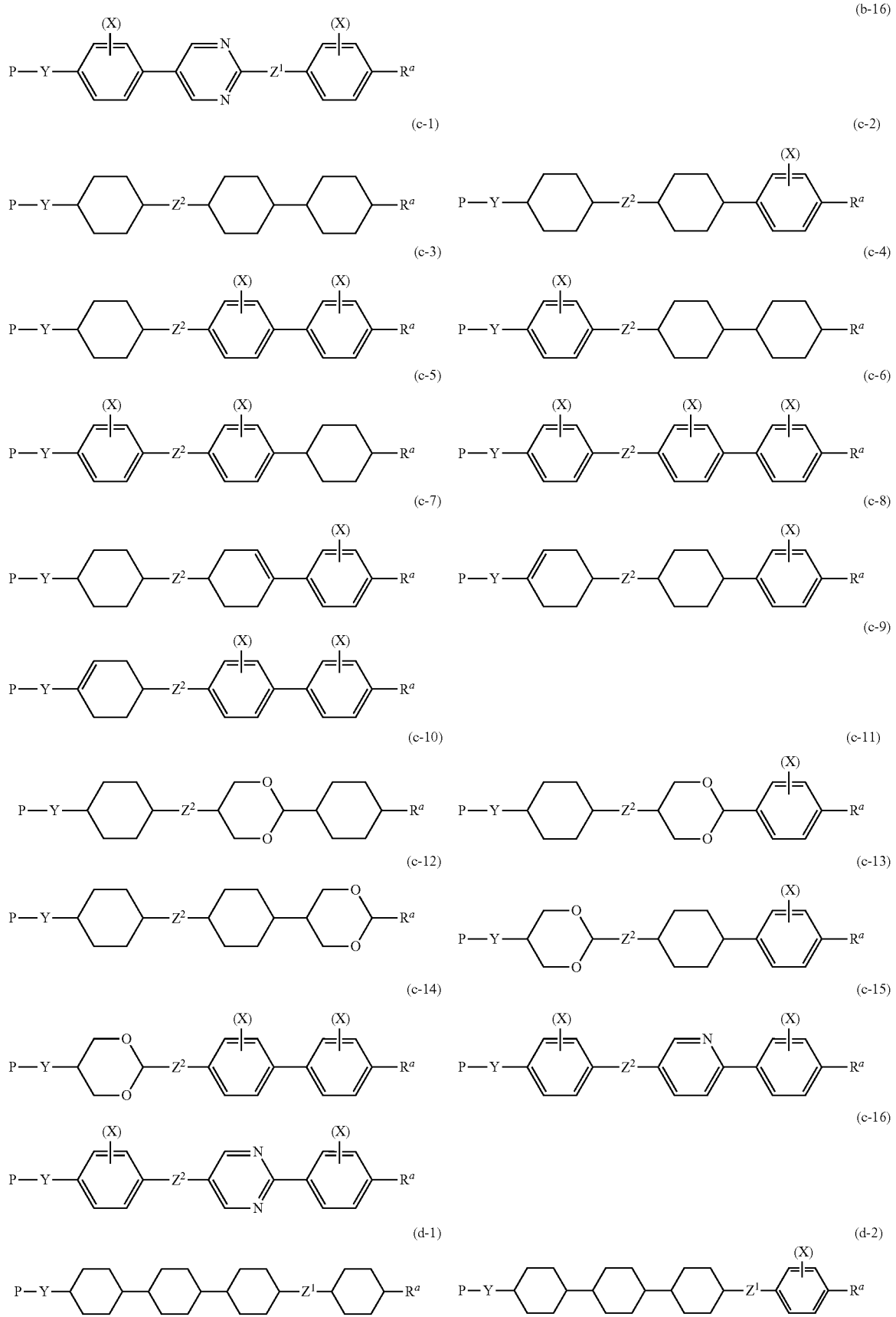

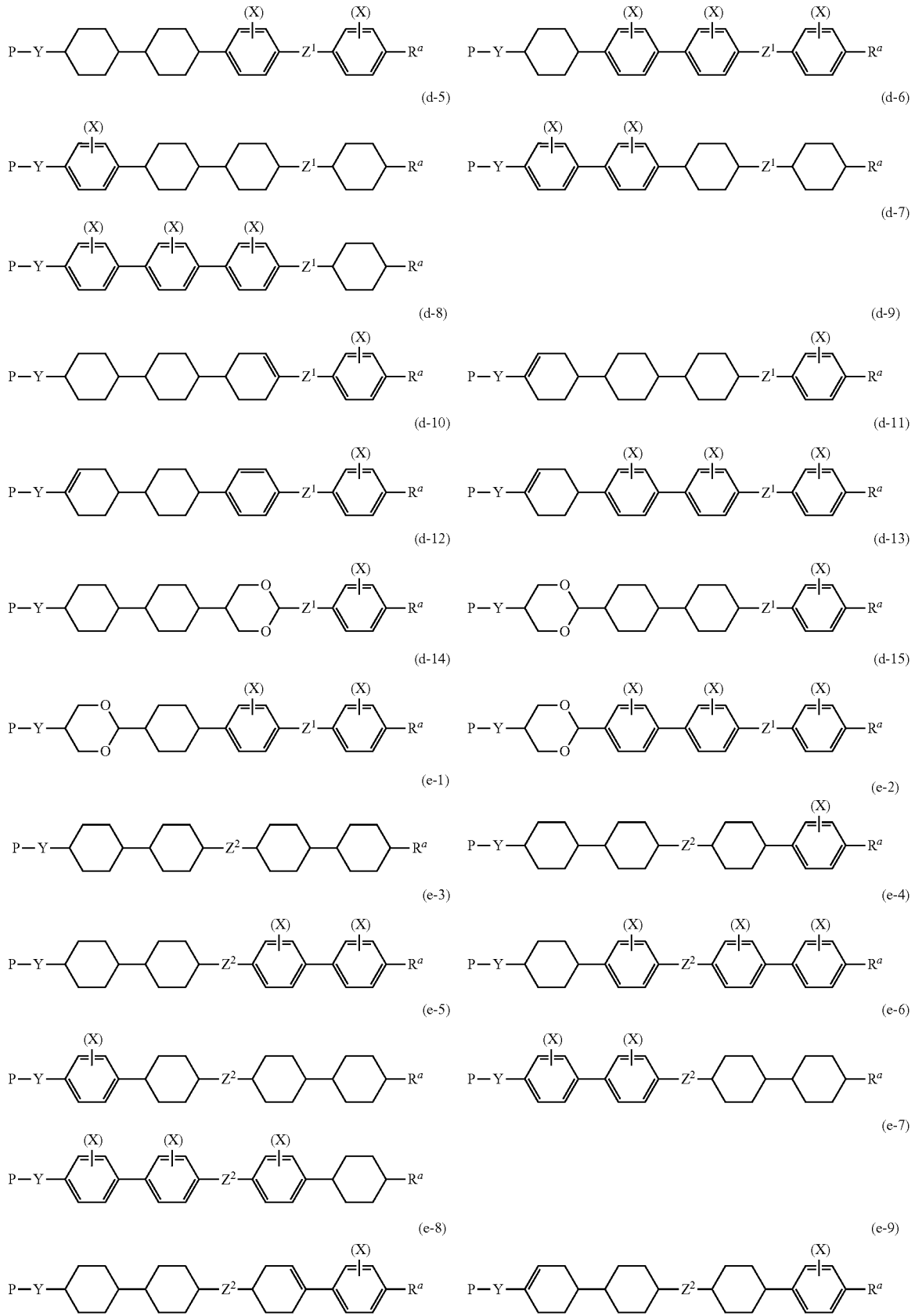

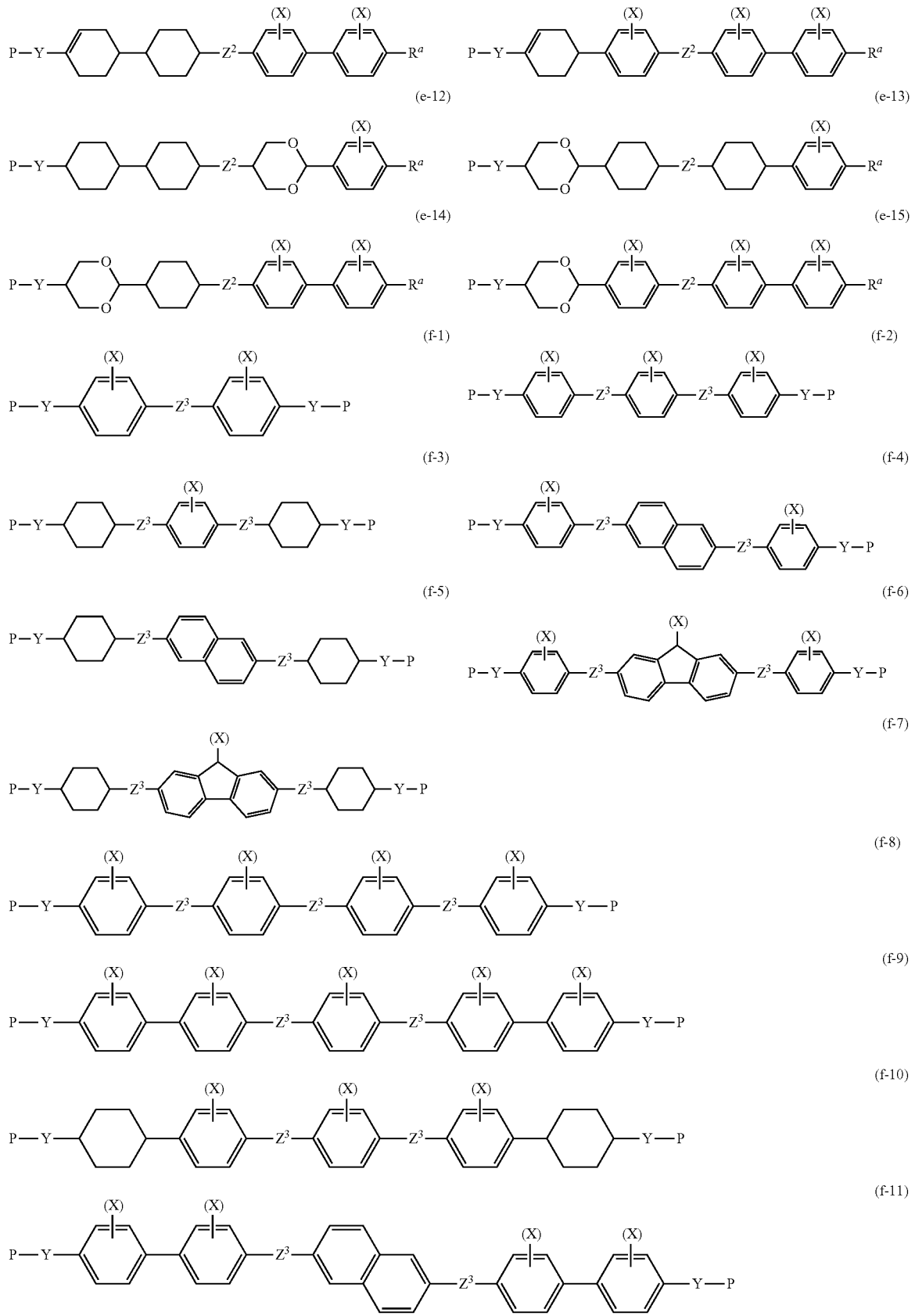

-continued
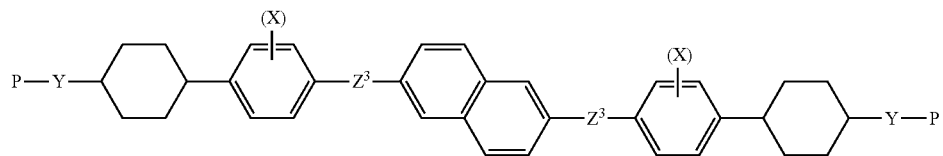
(f-12)
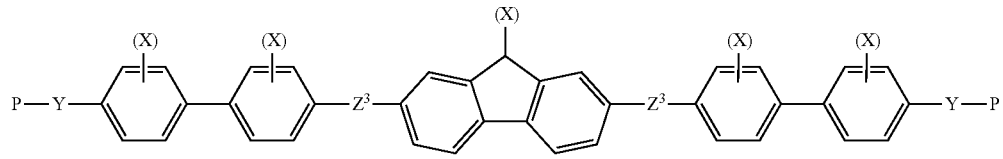
(f-13)
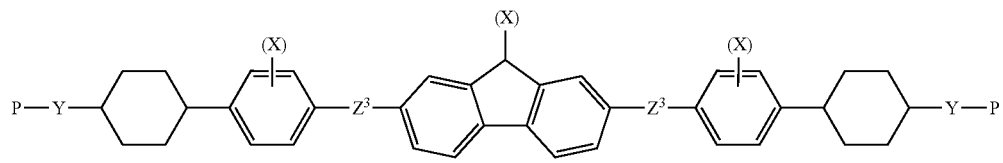
(f-14)
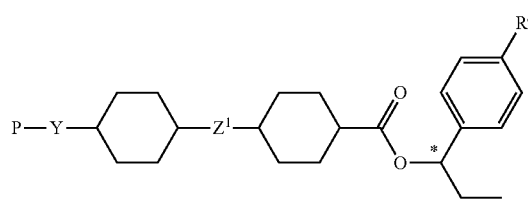
(g-1)
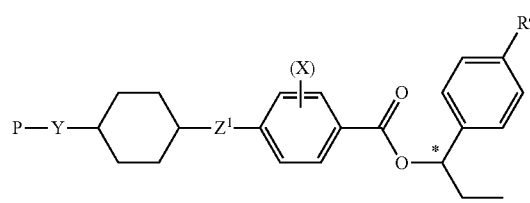
(g-2)
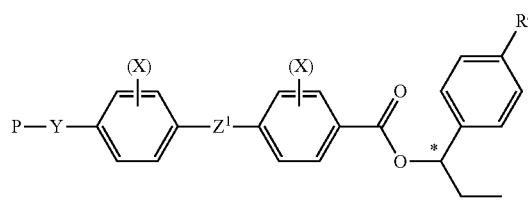
(g-3)
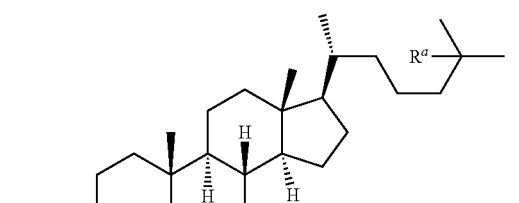
(g-4)
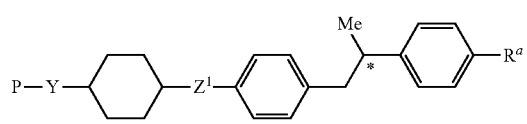
(g-5)
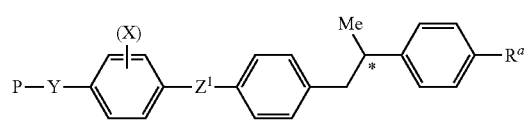
(g-6)
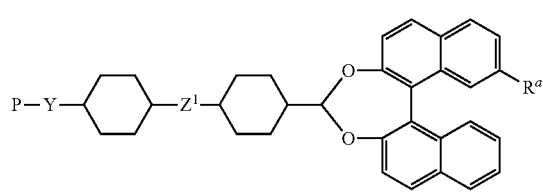
(g-7)
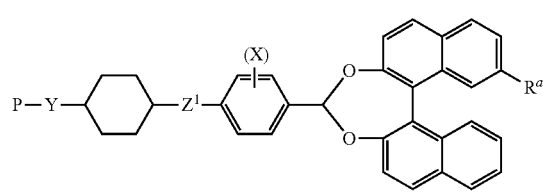
(g-8)
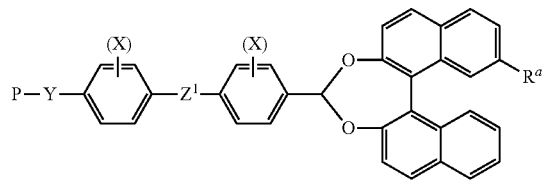
(g-9)

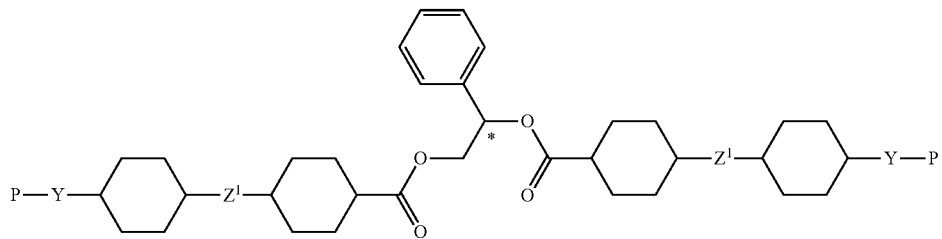
(g-10)
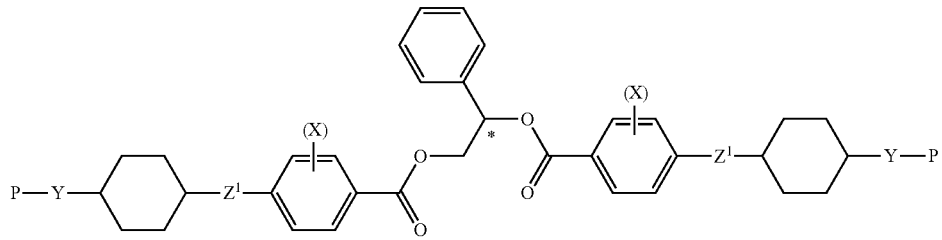
(g-11)
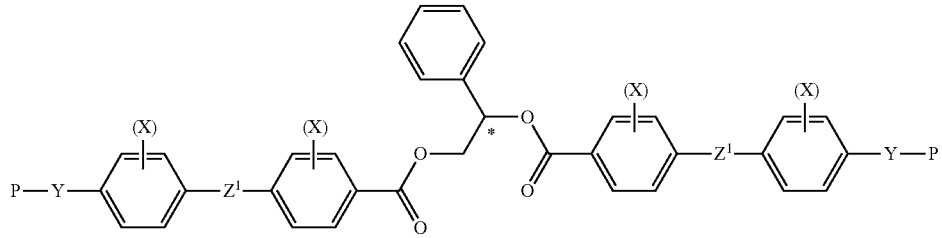
(g-12)
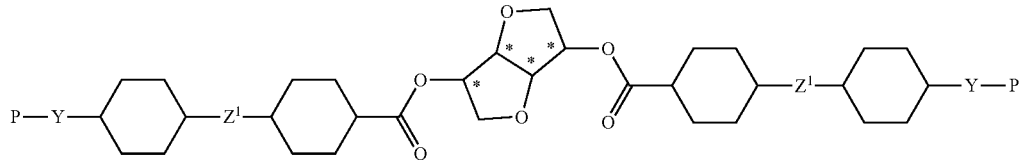
(g-13)
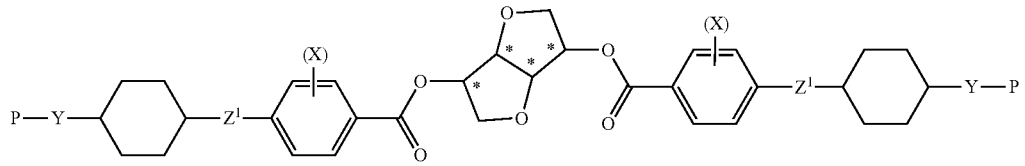
(g-14)
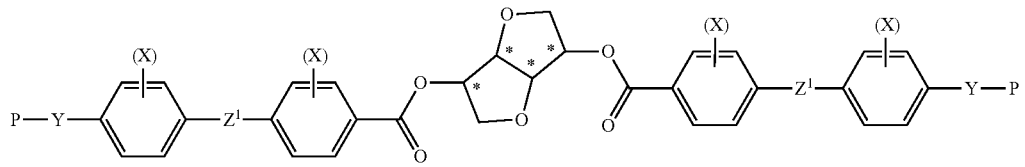
(g-15)
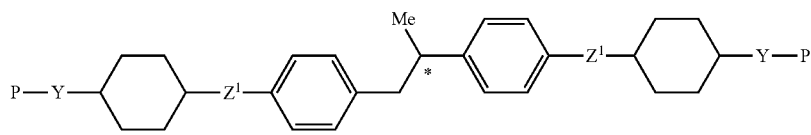
(g-16)
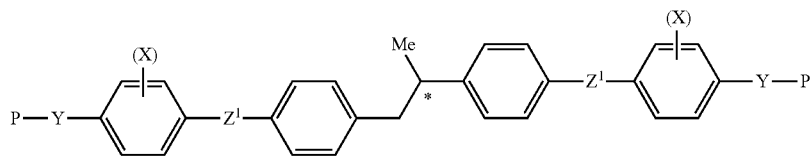
(g-17)

(g-18)

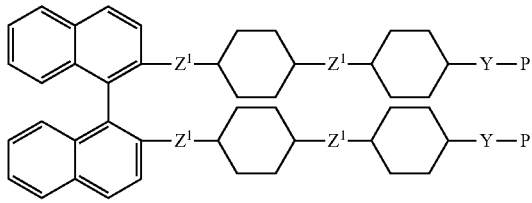

(g-19)

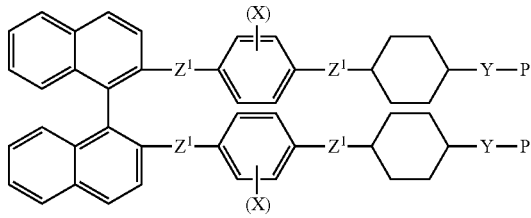

(g-20)

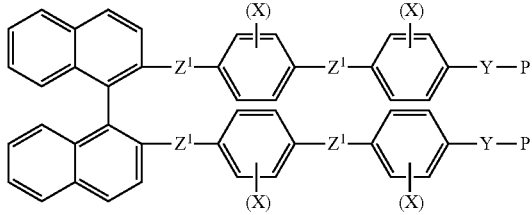

In formulas (a-1) to (g-20) described above, $R^a$, P and Y are as defined in formulas (1-a) and (1-b) described above.

$Z^1$ is each independently a single bond, —(CH$_2$)$_2$—, —(CF$_2$)$_2$—, —(CH$_2$)$_4$—, —CH$_2$O—, —OCH$_2$—, —(CH$_2$)$_2$O—, —O(CH$_2$)$_3$—COO—, —OCO—, —CH=CH—, —CF=CF—, —CH=CHCOO—, —OCOCH=CH—, —(CH$_2$)$_2$COO—, —OCO(CH$_2$)$_2$—, —C≡C—, —C≡C—COO—, —OCO—C≡C—, —C≡C—CH=CH—, —CH=CH—C≡C—, —CH=N—, —N=CH—, —N=N—, —OCF$_2$— or —CF$_2$O—. In addition, a plurality of $Z^1$ may be identical to or different from each other.

$Z^2$ is each independently —(CH$_2$)$_2$—, —(CF$_2$)$_2$—, —(CH$_2$)$_4$—, —CH$_2$O—, —OCH$_2$—, —(CH$_2$)$_3$O—, —O(CH$_2$)$_3$—, —COO—, —OCO—, —CH=CH—, —CF=CF—, —CH=CHCOO—, —OCOCH=CH—, —(CH$_2$)$_2$COO—, —OCO(CH$_2$)$_2$—, —C≡C—, —C≡C—COO—, —OCO—C≡C—, —C≡C—CH=CH—, —CH=CH—C≡C—, —CH=N—, —N=CH—, —N=N—, —OCF$_2$— or —CF$_2$O—.

$Z^3$ is each independently a single bond, alkyl having 1 to carbons, —(CH$_2$)$_a$—, —O(CH$_2$)$_a$O—, —CH$_2$O—, —OCH$_2$—, —O(CH$_2$)$_3$—, —(CH$_2$)$_3$O—, —COO—, —CCC—, —CH=CH—, —CH=CHCOO—, —OCOCH=CH—, —(CH$_2$)$_2$COO—, —OCO(CH$_2$)$_2$—, —CF=CF—, —C≡C—, —CH=N—, —N=CH—, —N=N—, —OCF$_2$— or —CF$_2$O—, and a plurality of $Z^3$ may be identical to or different from each other. Then, a is an integer from 1 to 20.

X is a substituent of 1,4-phenylene in which arbitrary hydrogen may be replaced by halogen, alkyl or alkyl fluoride, or a substituent of fluorene-2,7-diyl, and represents halogen, alkyl or alkyl fluoride.

Further preferred aspect of compound (1-1) described above will be described. Further preferred compound (1-1) can be represented by the formula (1-c) or (1-d) described below.

$$P^1\text{—Y-(A-Z)}_m\text{—}R^a \quad (1\text{-c})$$

$$P^1\text{—Y-(A-Z)}_m\text{—Y—}P^1 \quad (1\text{-d})$$

In the formulas described above, A, Y, Z, $R^a$ and m are as already defined, and $P^1$ represents a polymerizable group represented by formulas (2-1) to (2-2) described below. In the case of formula (1-d) described above, two $P^1$ represent identical polymerizable groups (2-1) to (2-2), and two Y represent identical groups, and two Y are bonded to be symmetric.

(2-1)

(2-2)

Further preferred specific examples of compound (1-1) described above are as described below.

| | Y | —(A-Z)m— |
|---|---|---|
| (f-1-1) | single bond, (CH$_2$)$_2$, (CH$_2$)$_6$, (CH$_2$)$_4$O, (CH$_2$)$_5$O | 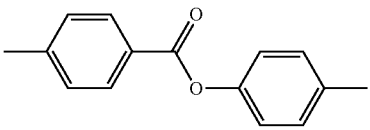 |

| | | |
|---|---|---|
| (f-1-2) | single bond, (CH$_2$)$_3$, (CH$_2$)$_5$, (CH$_2$)$_3$O, (CH$_2$)$_6$O | 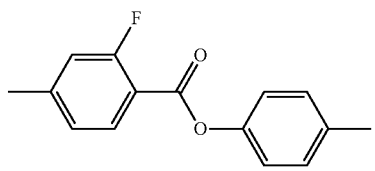 |
| (f-1-3) | single bond, (CH$_2$)$_2$, (CH$_2$)$_6$, (CH$_2$)$_4$O, (CH$_2$)$_6$O | 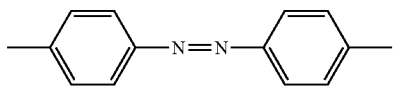 |
| (f-2-1) | single bond, (CH$_2$)$_3$, (CH$_2$)$_4$, (CH$_2$)$_3$O, (CH$_2$)$_6$O | 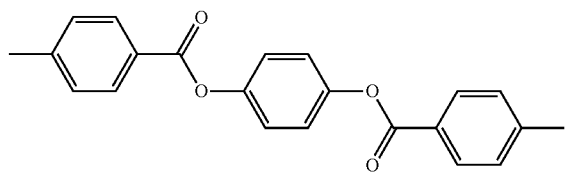 |
| (f-2-2) | single bond, (CH$_2$)$_4$, (CH$_2$)$_5$, (CH$_2$)$_4$O, (CH$_2$)$_6$O | 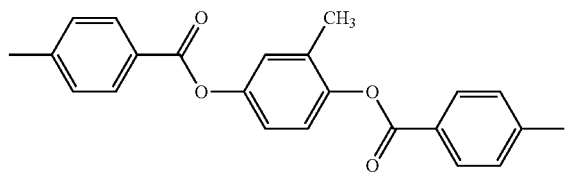 |
| (f-2-3) | single bond, (CH$_2$)$_2$, (CH$_2$)$_6$, (CH$_2$)$_3$O, (CH$_2$)$_6$O | 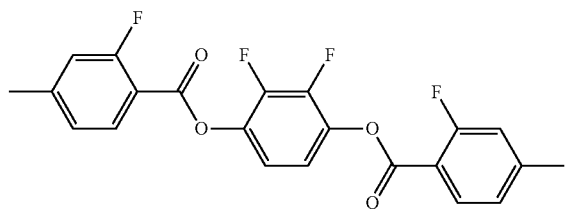 |
| (f-2-4) | single bond, (CH$_2$)$_4$, (CH$_2$)$_5$, (CH$_2$)$_4$O, (CH$_2$)$_6$O | 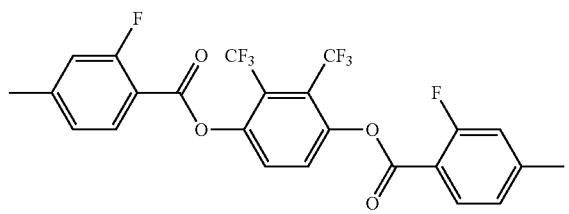 |
| (f-2-5) | single bond, (CH$_2$)$_2$, (CH$_2$)$_6$, (CH$_2$)$_4$O, (CH$_2$)$_5$O | 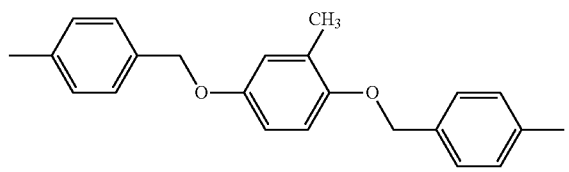 |
| (f-2-6) | single bond, (CH$_2$)$_3$, (CH$_2$)$_6$, (CH$_2$)$_3$O, (CH$_2$)$_5$O | 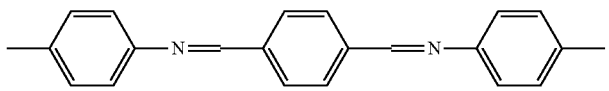 |
| (f-3-1) | single bond, (CH$_2$)$_3$, (CH$_2$)$_4$, (CH$_2$)$_3$O, (CH$_2$)$_6$O | 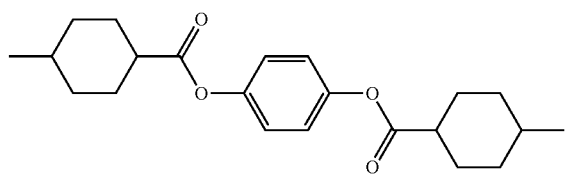 |

| | | |
|---|---|---|
| (f-3-2) | single bond, (CH$_2$)$_4$, (CH$_2$)$_5$, (CH$_2$)$_4$O, (CH$_2$)$_5$O | 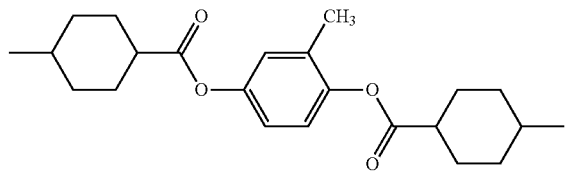 |
| (f-4-1) | single bond (CH$_2$)$_2$, (CH$_2$)$_4$, (CH$_2$)$_6$O, (CH$_2$)$_7$O | 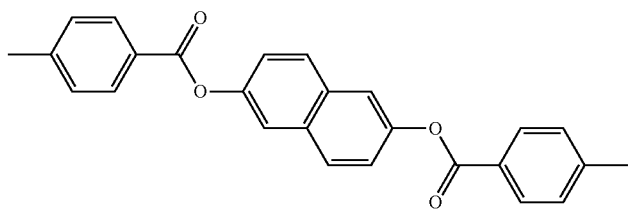 |
| (f-5-2) | single bond, (CH$_2$)$_3$, (CH$_2$)$_6$, (CH$_2$)$_4$O, (CH$_2$)$_6$O | 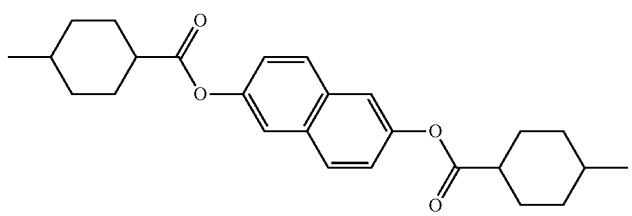 |

| Y | —(A-Z)m— |
|---|---|
| (f-6-1) single bond, (CH$_2$)$_3$, (CH$_2$)$_7$, (CH$_2$)$_3$O, (CH$_2$)$_6$O | 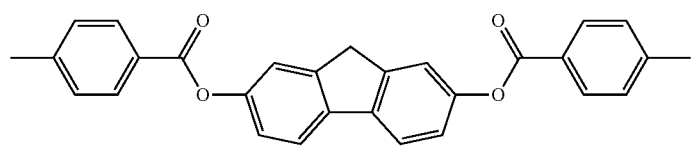 |
| (f-6-2) single bond, (CH$_2$)$_3$, (CH$_2$)$_5$, (CH$_2$)$_4$O, (CH$_2$)$_6$O | 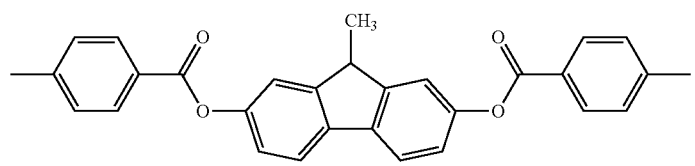 |
| (f-6-3) single bond, (CH$_2$)$_4$, (CH$_2$)$_5$, (CH$_2$)$_3$O, (CH$_2$)$_6$O | 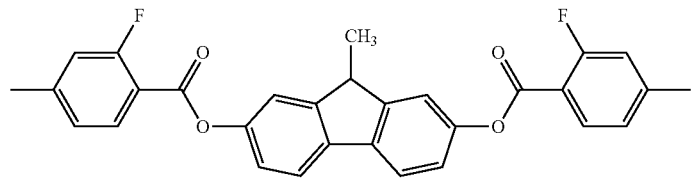 |
| (f-6-4) single bond, (CH$_2$)$_3$, (CH$_2$)$_6$, (CH$_2$)$_4$O, (CH$_2$)$_5$O | 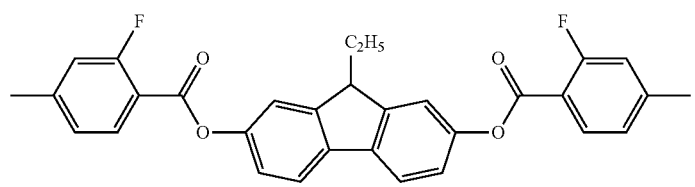 |
| (f-6-5) single bond, (CH$_2$)$_4$, (CH$_2$)$_6$, (CH$_2$)$_3$O, (CH$_2$)$_4$O | 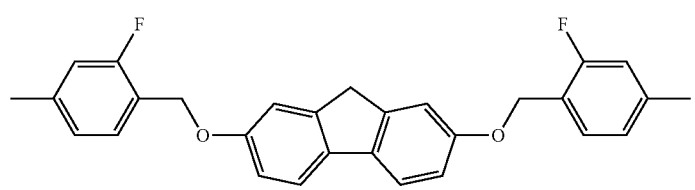 |

-continued
| | | —(A-Z)m— |
|---|---|---|
| (f-7-1) | single bond, (CH₂)₄, (CH₂)₅, (CH₂)₃O, (CH₂)₆O | 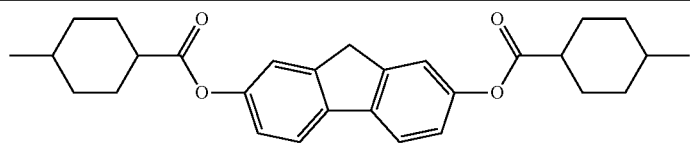 |
| (f-7-2) | single bond, (CH₂)₃, (CH₂)₇, (CH₂)₃O, (CH₂)₅O | 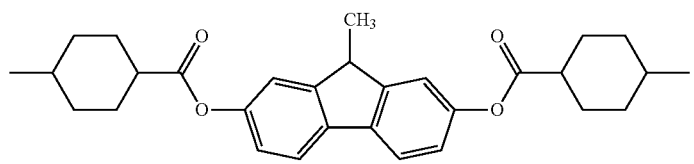 |
| (f-8-1) | single bond, (CH₂)₃, (CH₂)₅, (CH₂)₃O, (CH₂)₆O | 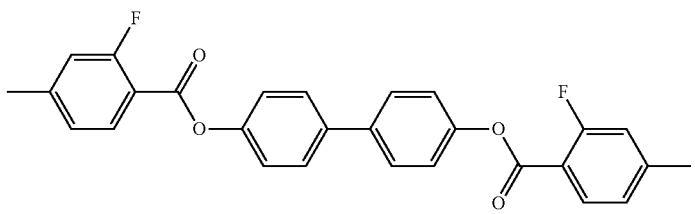 |
| (f-8-2) | single bond, (CH₂)₅, (CH₂)₇, (CH₂)₂O, (CH₂)₅O | 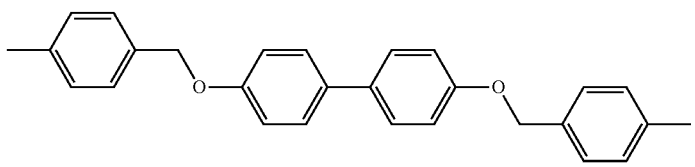 |
| (f-8-3) | single bond, (CH₂)₃, (CH₂)₄, CH₃O, (CH₂)₄O | 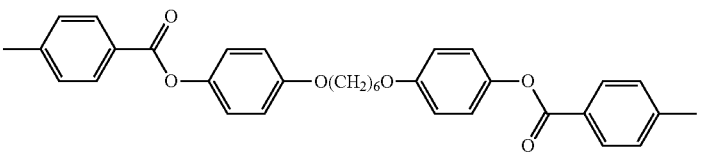 |
| (f-9-1) | single bond, (CH₂)₂, (CH₂)₄, (CH₂)₄O, (CH₂)₅O | 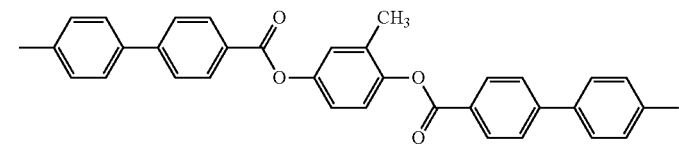 |
| (f-10-1) | single bond, (CH₂)₃, (CH₂)₆, (CH₂)₃O, (CH₂)₆O | 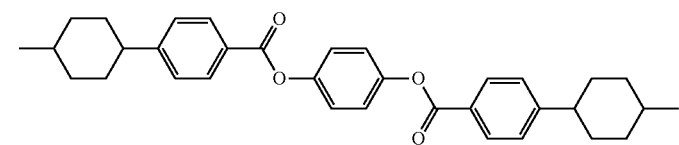 |
| Y | | —(A-Z)m— |
| (f-11-1) | single bond, (CH₂)₄, (CH₂)₅, (CH₂)₃O, (CH₂)₆O | 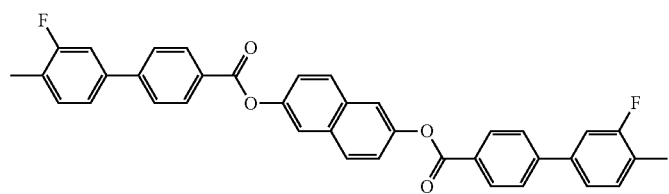 |
| (f-12-1) | single bond, (CH₂)₃, (CH₂)₅, (CH₂)₄O, (CH₂)₆O | 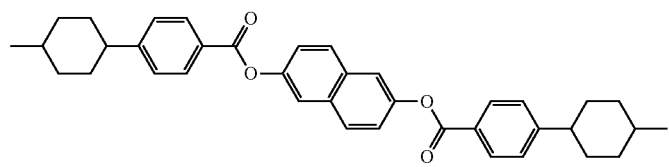 |

-continued

| | |
|---|---|
| (f-13-1) | single bond, $(CH_2)_3$, $(CH_2)_7$, $(CH_2)_3O$, $(CH_2)_5O$ |
| (f-13-2) | single bond, $(CH_2)_4$, $(CH_2)_6$, $(CH_2)_3O$, $(CH_2)_4O$ |
| (f-13-3) | single bond, $(CH_2)_3$, $(CH_2)_5$, $(CH_2)_4O$, $(CH_2)_5O$ |
| (f-14-1) | single bond, $(CH_2)_3$, $(CH_2)_5$, $(CH_2)_3O$, $(CH_2)_6O$ |
| (f-14-2) | single bond, $(CH_2)_3$, $(CH_2)_6$, $(CH_2)_3O$, $(CH_2)_6O$ |

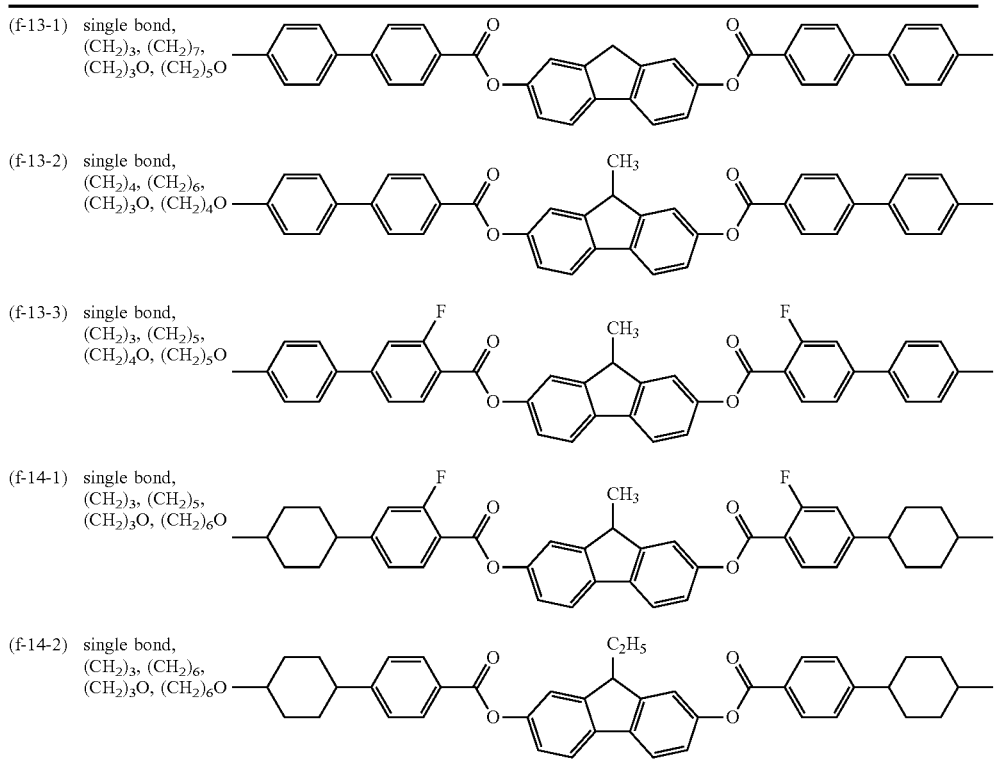

Synthesis Method of Compound (1-1)

Compound (1-1) described above can be synthesized by combining publicly-known techniques in synthetic organic chemistry. A method for introducing an objective terminal group, ring structure and bonding group into a starting material is described, for example, in books such as Houben-Weyl, Methods of Organic Chemistry, (Georg Thieme Verlag, Stuttgart), Organic Syntheses, (John Wiley & Sons, Inc.), Organic Reactions (John Wiley & Sons, Inc.), Comprehensive Organic Synthesis (Pergamon Press) and New Experimental Chemistry Course (Shin Jikken Kagaku Koza in Japanese) (Maruzen Co., Ltd.). Moreover, J P 2006-265527 A may be referred to.

If the polymerizable compound is polycyclic, heat resistance is improved, and if linearity is high, elongation or fluctuation due to heat between the inorganic fillers is small, and further phonon conduction of heat can be efficiently propagated, and therefore such a case is preferred. The polymerizable compound is polycyclic and has high linearity, resulting in exhibiting liquid crystallinity in many cases, and therefore thermal conduction is reasonably improved if the polymerizable compound has liquid crystallinity.

However, the bifunctional or higher functional polymerizable compound may be a polymerizable compound exhibiting no liquid crystallinity other than the polymerizable liquid crystal compound represented by formula (1-1) described above. Specific examples thereof include diglycidyl ether of polyether, diglycidyl ether of bisphenol A, diglycidyl ether of bisphenol F, diglycidyl ether of bisphenol or a compound exhibiting no liquid crystallinity by insufficiency of linearity among compounds of formula (1-1).

The polymerizable compound described above can be synthesized by combining publicly-known methods in synthetic organic chemistry.

The polymerizable compound to be used in the invention preferably has a bifunctional or higher functional group in order to form a bond with the coupling agent, including a case where a group is trifunctional or higher or tetrafunctional or higher. Further, a compound having a functional group at both ends of the long side of the polymerizable compound can form a linear bond, and therefore such a compound is preferred.

In addition, if an amount of surface modification by the polymerizable compound or the like is excessively small, the number of molecules bonding the sites between the fillers is excessively small, and therefore strength is reduced. If the amount is excessively large, properties of the resin are strongly exhibited, such as development of glass transition temperature. Accordingly, the amount of surface modification is desirably appropriately adjusted according to characteristics required therefor.

Inorganic Filler

Specific examples of the first inorganic filler, the second inorganic filler or the third inorganic filler each include nitride, carbide, a carbon material, metal oxide and a silicate mineral. The first inorganic filler, the second inorganic filler or the third inorganic filler may be identical to or different from each other.

More specifically, examples of the first inorganic filler, the second inorganic filler or the third inorganic filler include boron nitride, boron carbide, carbon boron nitride, graphite, a carbon fiber, and a carbon nanotube as an inorganic filler having high thermal conductivity. Alternatively, examples thereof include alumina, silica, magnesium oxide, zinc oxide, iron oxide, ferrite, mullite, cordierite, silicon nitride and silicon carbide.

The first inorganic filler, the second inorganic filler and the third inorganic filler may be present in a mixed manner.

In addition, the third inorganic filler is preferably a material having a functional group capable of bonding with an organic functional group of the coupling agent on the surface of the particle.

The inorganic filler is preferably boron nitride, aluminum nitride, silicon nitride, silicon carbide, graphite, a carbon fiber and a carbon nanotube. In particular, hexagonal boron nitride (h-BN) or graphite is preferred. Boron nitride or graphite has significantly high thermal conductivity in a plane direction, and boron nitride has a low dielectric constant and high insulation, and therefore such a material is preferred. For example, if boron nitride of a plate-like crystal is used, a plate-like structure is easily aligned along a mold due to flow or pressure of a raw material during molding and curing, and therefore such a case is preferred.

As a structure of the polymerizable compound, the polymerizable compound desirably has the shape and length with which the sites between the inorganic fillers can be efficiently directly bonded. A kind, the shape, a size, an amount of addition of the inorganic filler or the like can be appropriately selected according to the purpose. When the cured material of the composition for the heat-dissipating member requires insulation, an inorganic filler having conductivity may be applied as long as desired insulation can be kept. Examples of the shape of the inorganic filler include a plate-like shape, a spherical shape, an amorphous shape, a fibrous shape, a rod-like shape and a cylindrical shape.

A mean particle size of the inorganic filler is preferably 0.1 to 600 micrometers, and further preferably 1 to 200 micrometers. If the mean particle size is 0.1 micrometer or more, thermal conductivity is good and if the mean particle size is 200 micrometers or less, a filling factor can be increased.

In addition, the term "mean particle size" herein means a size based on measurement of a particle size distribution by a laser diffraction and scattering method. More specifically, when powder is separated into two sizes from a predetermined particle size by a wet method using analysis based on the Fraunhofer diffraction theory and the Mie scattering theory, the size at which an amount on a large side and an amount on a small side become equal (volume base) is taken as a median size.

A proportion of the inorganic filler to the coupling agent and the polymerizable compound depends on an amount of the inorganic filler to be used and an amount of the coupling agent to be bonded therewith. In the compound used as the first inorganic filler or the second inorganic filler (for example, boron nitride), as many coupling agents as possible are preferably bonded with the reactive groups to bond the organic compounds in the number equal to or slightly larger than the number of the reactive groups. An amount of reaction of the coupling agent to the inorganic filler changes mainly depending on the size of the inorganic filler or reactivity of the coupling agent to be used. For example, as the size of the inorganic filler increases, an area ratio of the side surfaces of the inorganic filler decreases, and therefore an amount of modification is small. As many coupling agents as possible are desired to be reacted, but if the size is decreased, thermal conductivity of a product is reduced, and therefore both are preferably balanced.

The composition for the heat-dissipating member may further contain the fourth inorganic filler that has high thermal conductivity, forms a metal bond with the first inorganic filler, the second inorganic filler or the third inorganic filler, or has a size smaller than the size of the first inorganic filler, the second inorganic filler, or the third inorganic filler, or the like. When the first inorganic filler and the second inorganic filler have the thermal expansion coefficients different from each other, if the materials are formed into a composite, a thermal expansion coefficient of a composite composition for the heat-dissipating member falls in an intermediate value when the composite is formed using each filler only. However, if the number of gaps of the filler is large without further treatment, not only the thermal conductivity is not increased, but the electrical insulation is reduced by intrusion of water into the gap. Therefore, the fourth filler having high thermal conductivity and the particle size smaller than the size of the first inorganic filler or the second inorganic filler is added thereto to fill the gaps of the first inorganic filler or the second inorganic filler, thereby improving stability of the material. Further, the thermal conductivity of the laminate can be increased by adding the fourth inorganic filler having the higher thermal conductivity in comparison with the case where the first inorganic filler or the second inorganic filler only is used. The inorganic filler used for the fourth inorganic filler is not restricted, but when high insulation is required, boron nitride, aluminum nitride, silicon carbide or silicon nitride is desirable, and when high insulation is not required, such a material having high thermal conductivity as diamond, a carbon nanotube, graphene and metal powder is desirable.

Specific examples of the fourth inorganic filler include an inorganic filler and a metal filler, such as alumina, silica, boron nitride, boron carbide, silicon carbide, aluminum nitride, silicon nitride, diamond, a carbon nanotube, graphite, graphene, silicon, beryllia, magnesium oxide, aluminum oxide, zinc oxide, silicon oxide, copper oxide, titanium oxide, cerium oxide, yttrium oxide, tin oxide, holmium oxide, bismuth oxide, cobalt oxide, calcium oxide, magnesium hydroxide, aluminum hydroxide, gold, silver, copper, platinum, iron, tin, lead, nickel, aluminum, magnesium, tungsten, molybdenum and stainless steel.

Coupling Agent

The first coupling agent or the second coupling agent, and the third coupling agent for modifying the metal layer preferably have an agent having a functional group with which the coupling agents can be bonded each other, an agent having a functional group capable of bonding with a functional group of a the bifunctional or higher functional polymerizable compound, or an agent having a functional group capable of bonding with a functional group of the third inorganic filler. When the functional group on the other side is oxiranyl, an acid anhydride residue or the like, the agent preferably reacts therewith, and therefore an agent having an amine-based reactive group at a terminal is preferred. Specific example thereof include Sila-Ace (registered trademark) S310, S320, S330 and S360 as an agent made by JNC Corporation, and KBM-903 and KBE-903 as an agent made by Shin-Etsu Chemical Co., Ltd. When the terminal on the other side is amine, a coupling agent having oxiranyl or the like at the terminal is preferred. Examples thereof include Sila-Ace (registered trademark) S510 and S530 as an agent made by JNC Corporation.

Examples of a combination of functional groups that form the bond between the coupling agent and the other side include a combination of oxiranyl and amino, a combination of vinyl and vinyl, a combination of methacryloxy and methacryloxy, a combination of carboxy or a carboxylic anhydride residue and amino and a combination of imidazole and oxiranyl, but are not limited thereto. A combination of functional groups that form the bond between the coupling agent and the other side is preferred. A combination providing high heat resistance is further preferred.

In addition, the first coupling agent, the second coupling agent and the third coupling agent may be identical to or different from each other.

Other Constituents

The composition for the heat-dissipating member may further contain an organic compound not bonded with the first inorganic filler and the second inorganic filler, namely the organic compound not contributed to the bond (for example, the polymerizable compound or a polymer compound), or may contain a polymerization initiator, a solvent or the like.

In the cured material of the composition for the heat-dissipating member, when porosity increases accordingly as the particle size of filler is increased in order to improve thermal conductivity, voids therein can be filled with a compound not bonded with the inorganic filler, and thermal conductivity and water vapor barrier performance can be improved.

Polymerizable Compound not Bonded Therewith

The composition for the heat-dissipating member may contain, as a constituent, a polymerizable compound not bonded with the inorganic filler (the compound is not always bifunctional or higher functional in the case). As such a polymerizable compound, a compound that does not inhibit heat curing of the inorganic filler, and causes neither evaporation nor bleeding out by heat is preferred. The polymerizable compounds are classified into a compound having no liquid crystallinity and a compound having liquid crystallinity. Specific examples of the polymerizable compound having no liquid crystallinity include a vinyl derivative, a styrene derivative, a (meth)acrylic acid derivative, a sorbic acid derivative, a fumaric acid derivative and an itaconic acid derivative. As a content, a composition for heat-dissipating member without containing the polymerizable compound not bonded therewith is first prepared to measure porosity of the resulting material, and the polymerizable compound in an amount capable of filling the voids is desirably added thereto.

Polymer Compound not Bonded Therewith

The composition for the heat-dissipating member may contain, as the constituent, the polymer compound not bonded with the inorganic filler. As such a polymer compound, a compound that does not reduce film formability and mechanical strength is preferred. The polymer compound may be a polymer compound that causes no reaction with the inorganic filler, the coupling agent and the polymerizable compound, and when the polymerizable compound is oxiranyl, and the silane coupling agent has amino, examples thereof include a polyolefin-based resin, a polyvinyl-based resin, a silicone resin and a wax. A content is desirably determined by first preparing a composition for heat-dissipating member without containing the polymerizable compound not bonded therewith, measuring porosity of the resulting material, and determining an amount the polymerizable compound to be added to fill the voids.

Non-Polymerizable Liquid Crystal Compound

The composition for the heat-dissipating member may contain, as the constituent, a liquid crystal compound having no polymerizable group. Examples of such a non-polymerizable liquid crystal compound are described in LiqCryst (LCI Publisher GmbH, Hamburg, Germany), which is a database of the liquid crystal compound. The composition containing the non-polymerizable liquid crystal compound is polymerized, whereby composite materials between the polymer of compound (1-1) and the liquid crystal compound can be obtained, for example. In such a composite material, the non-polymerizable liquid crystal compound is present in a polymer network such as a polymer dispersed liquid crystal. Therefore, such a liquid crystal compound as having characteristics having no fluidity in the temperature range to be used is desirable. The composite may be formed by such a technique as injecting the inorganic filler into the voids in the temperature range showing an isotropic phase after curing the inorganic filler, or the liquid crystal compound in an amount calculated for filling the voids in advance is mixed with the inorganic filler to polymerize the inorganic fillers with each other.

Polymerization Initiator

The composition for the heat-dissipating member may contain, as the constituent, the polymerization initiator. As the polymerization initiator, a photoradical polymerization initiator, a photocationic polymerization initiator, a thermal radical polymerization initiator or the like may be used, for example, according to the constituent of the composition and a polymerization method. In particular, the inorganic filler absorbs ultraviolet light, and therefore the thermal radical polymerization initiator is preferred.

Specific examples of a preferred initiator for thermal radical polymerization include benzoylperoxide, diisopropylperoxydicarbonate, t-butylperoxy-2-ethylhexanoate, t-butylperoxypivalate, di-t-butylperoxide (DTBPO), t-butylperoxydiisobutyrate, lauroylperoxide, 2,2'-azobisisodimethylbutyrate (MAIB), azobisisobutyronitrile (AIBN) and azobiscyclohexanecarbonitrile (ACN).

Solvent

The composition for the heat-dissipating member may contain the solvent. When the constituent that needs to be polymerized is contained in the composition, polymerization may be performed in the solvent or in a solvent-free state. The composition containing the solvent may be applied on the substrate by using spin coating, for example, and then the solvent may be removed to perform photopolymerization. Alternatively, the composition may be post-treated by heat curing by heating the resulting mixture to a suitable temperature after photo-curing.

Specific examples of a preferred solvent include benzene, toluene, xylene, mesitylene, hexane, heptane, octane, nonane, decane, tetrahydrofuran, γ-butyrolactone, N-methylpyrrolidone, dimethylformamide, dimethyl sulfoxide, cyclohexane, methylcyclohexane, cyclopentanone, cyclohexanone and PGMEA. The solvent may be used alone in one kind or in combination of two or more kinds.

In addition, limiting of a proportion of use of the solvent at the time of polymerization is less meaningful, and the proportion may be determined for each case in consideration of polymerization efficiency, solvent cost, energy cost or the like.

Others

A stabilizer may be added to the composition for the heat-dissipating member in order to facilitate handling. The stabilizer is not particularly limited as long as advantageous effects of the invention are not adversely affected, and specific examples thereof include an antioxidant, a curing agent, a copper inhibitor, a metal deactivator, a tackifier, an anti-aging agent, a defoaming agent, an antistatic agent and a weather-resistant agent. Specific examples of the antioxidant include hydroquinone, 4-ethoxyphenol and 3,5-di-t-butyl-4-hydroxytoluene (BHT).

For example, when a resin forming an adhesive layer is deteriorated by contact with metal, addition of the copper inhibitor or the metal deactivator as exemplified in JP H5-48265 A is preferred.

The copper inhibitor preferably includes Mark ZS-27 and Mark CDA-16 made by ADEKA Corporation; SANKO- EPOCLEAN made by Sanko Chemical Industry Co., Ltd.; and Irganox MD1024 made by BASF SE.

An amount of addition of the copper inhibitor is preferably 0.1 part by weight to 3 parts by weight based on 100 parts by weight in a total of the resin contained in the adhesive layer, in view of capability of preventing deterioration of the resin in a part in contact with the metal of the adhesive layer.

Further, an additive (such as oxide) may be added thereto for adjusting viscosity or color of the composition for the heat-dissipating member. Example thereof include titanium oxide for whitening, carbon black for blackening, and fine powder of silica for adjusting viscosity. Moreover, an additive may be added thereto for further increasing mechanical strength. Examples thereof include an inorganic fiber such as a glass fiber, a carbon fiber, and a carbon nanotube and a cloth, or as a polymer additive, a fiber of polyvinyl formal, polyvinylbutyral, polyester, polyamide, polyimide or the like or a supramolecule thereof.

Metal Layer

Figure 2:
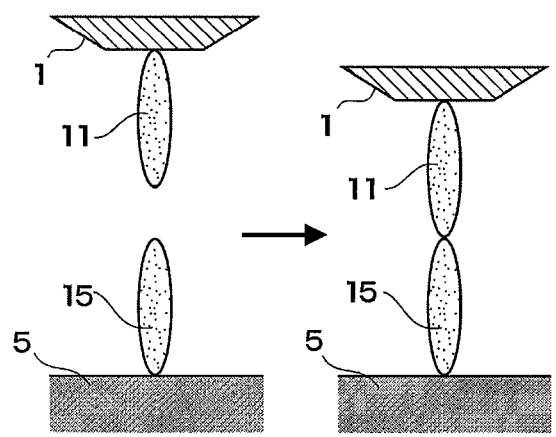
FIG. 2 is a conceptual diagram showing bonding of the other end of third coupling agent 15 bonded with metal layer 5 with first coupling agent 11 of first inorganic filler 1 by compression molding of a composition for a heat-dissipating member and a metal layer.
Figure 3:
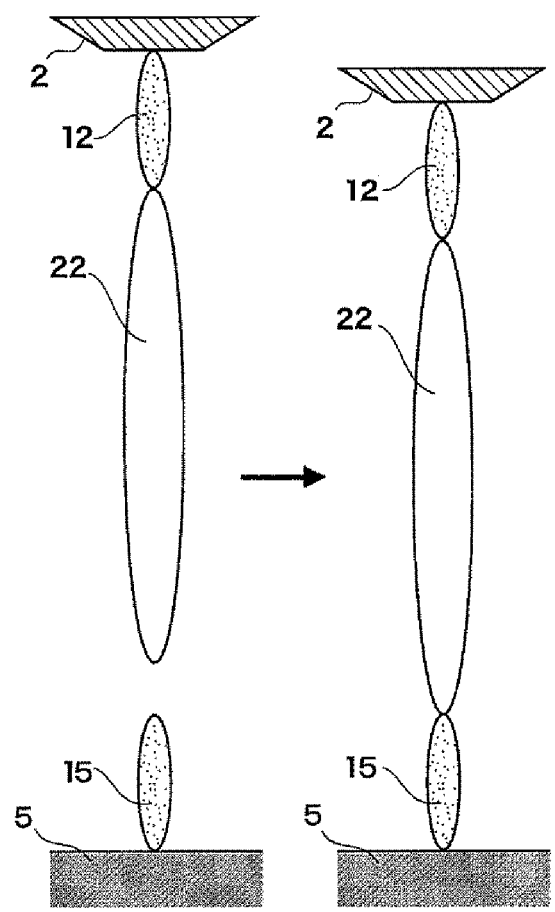
FIG. 3 is a conceptual diagram showing bonding of the other end of third coupling agent 15 bonded with metal layer 5 with polymerizable compound 22 of second inorganic filler 2 by compression molding of a composition for a heat-dissipating member and a metal layer.
Figure 4:
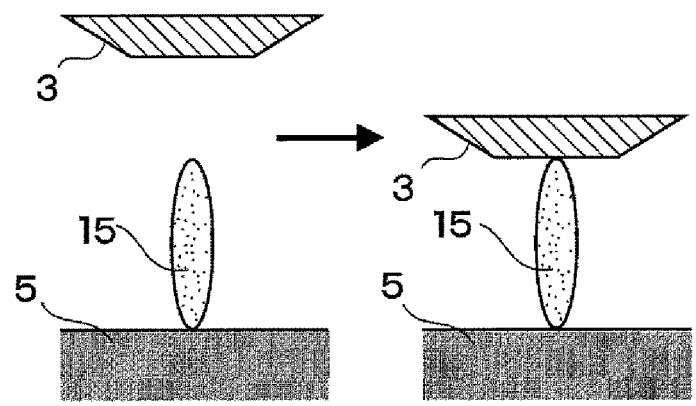
FIG. 4 is a conceptual diagram showing bonding of the other end of third coupling agent 15 bonded with metal layer 5 with third inorganic filler 3 by compression molding of a composition for a heat-dissipating member and a metal layer.

As shown in FIGS. 2 to 4, the bond is formed between the metal layer and the first inorganic filler, the second inorganic filler, or the third inorganic filler through the coupling agent and the like to form the laminate.

Specific examples of the metal layer include copper, aluminum, nickel, gold, or an alloy thereof. In addition, the bond between the inorganic filler and the metal layer is formed between the metal positioned on an outermost surface of the metal layer and the inorganic filler. Thus, in a material having a thin film of plating or the like, the bond through the coupling agent and the polymerizable compound is formed between a plating material and the inorganic filler. Thus, the metal layer may be metal that may be the plating material.

A thickness of the metal layer is not particularly restricted, and the thickness according to an application can be used. A thicker layer is excellent in heat dissipation performance, and therefore such a layer is preferred.

The metal layer only needs to have a shape according to which the composition for the heat-dissipating member can be applied to form the laminate with a layer formed of the inorganic filler contained in the composition for the heat-dissipating member, and examples thereof include a plate-like shape and a rod-like shape.

The metal layer can be used not only as a heat-dissipating material but also as a metal electrode. Therefore, the metal layer may be formed in one metal electrode, or a metal electrode in a state in which one metal electrode is divided into a plurality. More specifically, the metal layer may be a layer formed of a plurality of metal electrodes. Thus, the laminate of the present application can also be used as an electronic circuit board (printed circuit board) having thermal conductivity, heat dissipation and insulation.

Production Method

Hereinafter, a method for producing the composition for the heat-dissipating member and a method for producing the laminate from the composition and the metal layer will be specifically described by taking the composition for the heat-dissipating member, containing the first inorganic filler and the second inorganic filler as an example.

(1) Applying Coupling Treatment

The first inorganic filler is subjected to coupling treatment to bond one end of the coupling agent with the first inorganic filler. As the coupling treatment, a publicly-known method can be used.

As an example, the inorganic filler and the coupling agent are first added to the solvent. The resulting mixture is stirred by using a stirrer or the like, and then the resulting material is dried. After solvent drying, heat treatment is performed under vacuum conditions using a vacuum dryer or the like. The solvent is added to the inorganic filler obtained to homogenize the resulting mixture by ultrasonic treatment. The resulting solution is separated and purified using a centrifuge. A supernatant is discharged, and then the solvent is added thereto, and the same operation is repeated several times. An oven is used to dry the purified inorganic filler subjected to coupling treatment.

(2) Modifying with the Polymerizable Compound.

The second inorganic filler is subjected to coupling treatment (or the first inorganic filler subjected to coupling treatment may be used as the second inorganic filler) to further bond the bifunctional or higher functional polymerizable compound with the other end of the coupling agent.

As an example, the inorganic filler subjected to coupling treatment, and the bifunctional or higher functional polymerizable compound are mixed by using an agate mortar or the like, and then the resulting material is kneaded by using a 2-roll mill or the like. Then, the resulting material is separated and purified by ultrasonic treatment and centrifugal separation.

(3) Mixing

The first inorganic filler and the second inorganic filler are weighed to be 1:1 in a weight the inorganic filler only, for example, and the resulting material is mixed in the agate mortar or the like. Then, the resulting mixture is mixed using the 2-roll mill or the like to obtain the composition for the heat-dissipating member.

A mixing ratio of the first inorganic filler to the second inorganic filler is preferably 1:0.1 to 1:30, further preferably 1:3 to 1:20, and still further preferably 1:4 to 1:10 in terms of a weight ratio in the weight of the inorganic filler only, for example, when a bonding group that forms the bond between the first inorganic filler and the second inorganic filler is amino group and epoxy group for the first inorganic filler and the second inorganic filler, respectively. The mixing ratio is determined by the number of terminal bonding groups that form the bond between the first inorganic filler and the second inorganic filler. For example, primary amine can react with two pieces of oxiranyl, and therefore the amount may be relatively smaller than the amount on an oxiranyl side, and a ring on the oxiranyl side has a possibility of being opened, and therefore oxiranyl in an excess than the amount calculated from an epoxy equivalent is preferably used.

In addition, the heat-dissipating member containing the second inorganic filler only may be formed without mixing the first inorganic filler and the second inorganic filler.

(4) Producing the Laminate

As an example, the method of producing the laminate with the metal layer by using the composition for the heat-dissipating member will be described. A mixture of the third coupling agent and pure water is applied on the metal layer, and the resulting material is heated to modify a surface of the metal layer with the third coupling agent.

The composition for the heat-dissipating member is arranged (for example, applied) on a side of the coupling agent of the metal layer bonded with the third coupling agent, the resulting material is inserted into hot plates, and compression-molded using a compression molding machine to perform aligning, and curing and molding of the composition for the heat-dissipating member. Further, the resulting material is post-cured using the oven or the like to obtain the laminate. Thus, formation of the inorganic filler layer, and connection of the inorganic filler layer and the metal layer can be performed by one-time heating and thermocompression bonding.

A temperature during compression molding is in the range of room temperature to 350° C., preferably room temperature to 250° C., and further preferably 50° C. to 200° C., and a time therefor is in the range of 5 seconds to 10 hours, preferably 1 minute to 5 hours, and further preferably 5 minutes to 1 hour. After curing the composition, the resulting material is preferably gradually cooled in order to suppress stress-strain or the like. Moreover, reheating treatment may be performed to relax strain or the like. Thus, formation of the inorganic filler layer and connection of the inorganic filler layer and the metal layer can be performed by thermocompression bonding at a comparatively low temperature.

A film thickness of the inorganic filler layer is preferably smaller in order to improve thermal conductivity in a vertical direction, and is preferably 30 micrometers to 2,000 micrometers, further preferably 30 micrometers to 1,000 micrometers, and still further preferably 30 micrometers to 500 micrometers. A film thickness of the inorganic filler layer and the metal layer may be appropriately changed according to the application.

As described above, the laminate according to the first embodiment of the invention has the cured material obtained by curing the composition for the heat-dissipating member, and the metal layer. The cured material of the composition for the heat-dissipating member has high thermal conductivity, and simultaneously takes a negative value to a positive value in the thermal expansion coefficient according to a kind, a blending ratio, curing conditions or the like of an organic material and an inorganic material to be used, and is excellent in chemical stability, hardness, mechanical strength and the like. In addition, the term "mechanical strength" described above means Young's modulus, tensile strength, tear strength, flexural strength, flexural modulus, impact strength and the like.

The laminate of the invention is useful for a heat sink, a heat-dissipating sheet, a heat-dissipating film, a heat-dissipating adhesive, a heat-dissipating molded article and the like. Further, the laminate of the invention can also be used as an electronic circuit board (printed circuit board) having thermal conductivity, heat dissipation and insulation.

Figure 6:
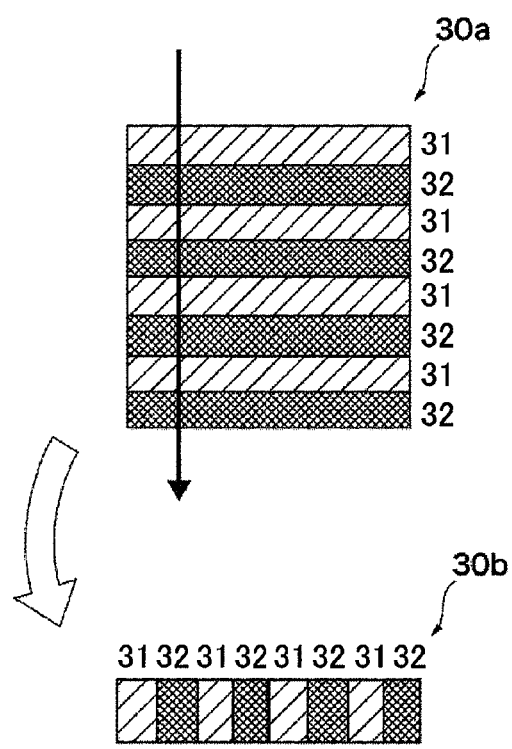
FIG. 6 is a conceptual diagram in the case of forming laminate 30*b* laminated in a horizontal direction from laminate 30*a* laminated in a thickness direction so as to be positive (31), negative (32), and repetition of positive and negative in a thermal expansion coefficient.

Further, the laminate of the invention is different in the thermal expansion coefficient of the layer formed of the inorganic filler depending on a kind, a blending ratio, curing conditions or the like of the inorganic material and the organic material contained therein. More specifically, the layer having a different composition ratio of the inorganic filler has a different thermal expansion coefficient. Therefore, the laminate of the invention may be laminated to be continuous or discontinuous in the thermal expansion coefficient of each layer. For example, as shown in FIG. 6, laminated body 30a which is laminated in a thickness direction so as to be positive (31), negative (32), and repetition of positive and negative in the thermal expansion coefficient of each layer. Further, laminate 30b in which laminate 30a is cut in an arrow direction, and each layer and the next layer are laminated in a horizontal direction and not in the thickness direction may be formed. If the layers having positive and negative thermal expansion coefficients are arranged adjacently with each other, the thermal expansion coefficient can be controlled so as to offset positive and negative.

Electronic Equipment

Electronic equipment according to a second embodiment of the invention has the laminate according to the first embodiment and an electronic device having a heat generation unit. The laminate is arranged in the electronic device so as to be in contact with the heat generation unit described above. An aspect of the laminate may be any of the heat-dissipating electronic circuit board, the heat sink, the heat-dissipating sheet, the heat-dissipating film, the heat-dissipating adhesive, the heat-dissipating molded article and the like.

Examples of the electronic device include a semiconductor element. The laminate of the present application has high heat resistance and high insulation in addition to high thermal conductivity. Therefore, the laminate has high power among the semiconductor elements, and therefore the laminate is particularly effective in a power semiconductor of silicon, silicon carbide, gallium nitride, gallium oxide, diamond or the like, requiring a further efficient heat dissipation mechanism. Examples of the electronic equipment equipped with the power semiconductor described above include a main transducer of large power inverter, an uninterruptible power supply unit, a variable-frequency drive for an AC motor, a controller for a railway vehicle, an electric vehicle such as a hybrid car and an electric car, and an IH cooker.

EXAMPLES

The invention will be described in detail below using Examples. However, the invention is not limited to the content described in Examples below.

Component materials used in Examples of the invention are as described below.

Inorganic Filler

Boron nitride: h-BN particles, (trade name) PolarTherm PTX-25, made by Momentive Performance Materials Japan LLC Silane Coupling Agent 3-aminopropyltrimethoxysilane, (trade name) KBM-903, made by Shin-Etsu Chemical Co., Ltd.

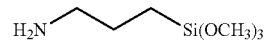

N-(2-aminoethyl)-3-aminopropyltrimethoxysilane, (trade name) S320, made by JNC Corporation

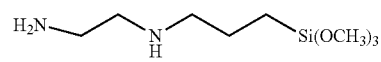

3-glycidoxypropyltrimetoxysilane, (trade name) S510, made by JNC Corporation

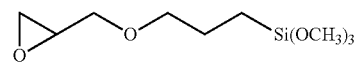

2-(3,4-epoxycyclohexyl)ethyltrimethoxysilane, (trade name) S530, made by JNC Corporation

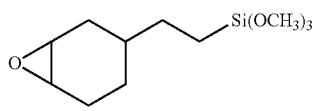

Polymerizable Compound
Polymerizable oxiranyl compound, the following formula (1-11), made by JNC Corporation

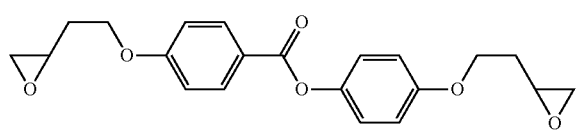

(1-11)

Polymerizable oxiranyl compound, (trade name) jER807, made by Mitsubishi Chemical Corporation
Amine-Based Curling Agent
4,4'-diamino-1,2-diphenylmethane, made by FUJIFILM Wako Pure Chemical Corporation
Metal Foil
Copper foil, (trade name) FS-WS, made by Furukawa Electric Co., Ltd.
Aluminum foil, catalog No. 1N30-O, made by UACJ Foil Corporation,
Nickel foil, purity: 99% or more, made by Nilaco Corporation Example 1

Step of Preparation of Filler A
To 100 mL of toluene, 10 g of boron nitride particles (PolarTherm PTX-25, made by Momentive Performance Materials Japan LLC) and 1 g of a silane coupling agent (S320, made by JNC Corporation) were added, and the resulting material was stirred using a stirrer at 500 rpm for 1 hour, and the resulting mixture was dried at 40° C. for 4 hours. Further, after solvent drying, the resulting material was subjected to heat treatment under vacuum conditions for 5 hours using a vacuum dryer set at 120° C. The resulting particles were taken as filler A. Filler A is the particles in a state in which the inorganic filler was modified with the silane coupling agent.
Step of Preparation of Filler B
Then, 2 g of filler A and 3.2 g of compound (1-11) made by JNC Corporation were measured, and the materials were mixed using a 2-roll mill (IMC-AE00 model, made by Imoto Machinery Co., LTD.) at 120° C. for 10 minutes. A weight ratio used indicates the number of oxiranyl rings with which an amino group of filler particles A sufficiently reacts, and an amount at which both materials can be sufficiently kneaded on the 2-roll mill. The resulting mixture was added to 45 mL of tetrahydrofuran, and the resulting mixture was sufficiently stirred, and then an insoluble matter was precipitated with a centrifuge (High-Speed Refrigerated Centrifuge CR22N model, made by Hitachi Koki Co., Ltd., at 4,000 rpm×10 minutes×25° C.), and a solution containing a portion in which an unreacted oxiranyl compound was dissolved was eliminated by decantation. Then, 45 mL of acetone was added thereto, and the same operation as described above was performed. Further, the same operation was repeated in the order of tetrahydrofuran and acetone. Particles obtained by drying the insoluble matter are taken as filler B. Filler B is the particles in a state in which the inorganic filler was modified with a silane coupling agent and a polymerizable oxiranyl compound.
Step of Preparation of Metal-Inorganic Material Laminate
An amino-based silane coupling agent (KBM-903, made by Shin-Etsu Chemical Co., Ltd.) and pure water were mixed at 99:1 (weight ratio), and the resulting mixture was applied on copper foil (FS-WS, thickness: 18 μm, made by Furukawa Electric Co., Ltd.) by using a brush, and then the resulting copper foil was heated on a hot plate at 50° C. for 60 minutes.

Then, 0.14 g of filler A and 0.56 g of filler B were measured, and mixed. Then, the copper foil was placed on a stainless steel plate with a silane coupling agent-treated surface upward (so as to be in contact with the fillers), and the mixed filler was placed thereon, and the resulting material was interposed with stainless steel plates, and the resulting assembly was pressured to 30 MPa by using a compression molding machine (IMC-19EC, made by Imoto Machinery Co., Ltd.) set at 150° C., and a heating state was continued for 15 minutes to perform alignment treatment and pre-curing. More specifically, when the mixture spreads between the stainless steel plates, BN particles are plate-like particles, and therefore the particles are aligned to be in parallel with the stainless steel plate. Moreover, an amount of the mixture was adjusted to be 500 μm in a thickness of the laminate.
Evaluation
Adhesiveness was confirmed as described below.
Removal from Stainless Steel Plate
When the above-described metal-inorganic material laminate was removed from the stainless steel plate, whether or not the copper foil and the filler were peeled off was confirmed.

A laminate in which the copper foil and the filler were completely peeled off was deemed as poor, a laminate in which both were partially peeled off was deemed as marginal, and a laminate in which both were not peeled off at all was deemed as excellent, and the laminates deemed as marginal and excellent were post-cured by using an oven at 150° C. for 12 hours to prepare metal-inorganic material laminates.

PET films NeoFix 10, NeoFix 30, NeoFix 50 and NeoFix 100 with an acrylic adhesive made by Nichiei Kakoh Co., Ltd. (tackiness to a stainless steel plate: 5.0 N/20 mm, 13.4 N/20 mm, 16.0 N/20 mm and 27.9 N/20 mm, respectively) were sufficiently adhered on the copper foil of the metal-inorganic material laminates by hand, and the resulting materials were left to stand at room temperature for 20 minutes. Then, the PET film was peeled off by hand, and adhesiveness was evaluated based on whether or not a metal piece was peeled off from the metal-inorganic material laminate. A laminate in which the copper foil and the inorganic material were completely peeled off was deemed as poor, a laminate in which both were partially peeled off was deemed as marginal, and a laminate in which both were not peeled off at all was deemed as excellent.

Example 2

Preparation and evaluation were performed in the same manner as in Example 1 except that an amino-based silane coupling agent (S320, made by JNC Corporation) was used in place of the silane coupling agent KBM-903.

Example 3

Preparation and evaluation were performed in the same manner as in Example 1 except that an oxiranyl-based silane coupling agent (S510, made by JNC Corporation) was used in place of the silane coupling agent KBM-903.

Example 4

Preparation and evaluation were performed in the same manner as in Example 1 except that an oxiranyl-based silane coupling agent (S530, made by JNC Corporation) was used in place of the silane coupling agent KBM-903.

Example 5

Preparation and evaluation were performed in the same manner as in Example 1 except that aluminum foil (Aluminum Foil, thickness: 20 μm, made by UACJ Foil Corporation) was used in place of the copper foil.

Example 6

Preparation and evaluation were performed in the same manner as in Example 2 except that aluminum foil (Aluminum Foil, thickness: 20 μm, made by UACJ Foil Corporation) was used in place of the copper foil.

Example 7

Preparation and evaluation were performed in the same manner as in Example 3 except that aluminum foil (Aluminum Foil, thickness: 20 μm, made by UACJ Foil Corporation) was used in place of the copper foil.

Example 8

Preparation and evaluation were performed in the same manner as in Example 4 except that aluminum foil (Aluminum Foil, thickness: 20 μm, made by UACJ Foil Corporation) was used in place of the copper foil.

Example 9

Preparation and evaluation were performed in the same manner as in Example 1 except that nickel foil (Nickel Foil, thickness: 50 μm, made by Nilaco Corporation) was used in place of the copper foil.

Example 10

Preparation and evaluation were performed in the same manner as in Example 2 except that nickel foil (Nickel Foil, thickness: 50 μm, made by Nilaco Corporation) was used in place of the copper foil.

Example 11

Preparation and evaluation were performed in the same manner as in Example 3 except that nickel foil (Nickel Foil, thickness: 50 μm, made by Nilaco Corporation) was used in place of the copper foil.

Example 12

Preparation and evaluation were performed in the same manner as in Example 4 except that nickel foil (Nickel Foil, thickness: 50 μm, made by Nilaco Corporation) was used in place of the copper foil.

Comparative Example 1

Preparation and evaluation were performed in the same manner as in Example 1 except that no silane coupling agent was used on a surface of copper foil, and untreated copper foil and a filler were interposed therebetween, and the resulting assembly was pressurized and heated.

Comparative Example 2

Preparation and evaluation were performed in the same manner as in Example 1 except that a polymerizable oxiranyl compound: jER 807 (made by Mitsubishi Chemical Corporation) and an amine-based curing agent (DDM): 4,4'-diamino-1,2-diphenylmethane (made by FUJIFILM Wako Pure Chemical Corporation) were mixed at a mixing ratio of 0.7 g: 0.2 g for 5 minutes by using a fluorocarbon resin spatula, in place of the silane coupling agent KBM-903, and then the resulting material was applied on a surface of copper foil by using a brush.

Comparative Example 3

Preparation and evaluation were performed in the same manner as in Comparative Example 1 except that aluminum foil was used in place of the copper foil.

Comparative Example 4

Preparation and evaluation were performed in the same manner as in Comparative Example 2 except that aluminum foil was used in place of the copper foil.

Comparative Example 5

Preparation and evaluation were performed in the same manner as in Comparative Example 1 except that nickel foil was used in place of the copper foil.

Comparative Example 6

Preparation and evaluation were performed in the same manner as in Comparative Example 2 except that nickel foil was used in place of the copper foil.

TABLE 1

| | Metal | Surface treatment or the like | Removed from stainless steel | Neo Fix 10 5.0 N/20 mm | Neo Fix 30 13.4 N/20 mm | Neo Fix 50 16.0 N/20 mm | Neo Fix 100 27.9 N/20 mm |
|---|---|---|---|---|---|---|---|
| Example 1 | Copper | KBM-903 | Excellent | Excellent | Excellent | Poor | — |
| Example 2 | Copper | S320 | Excellent | Excellent | Poor | — | — |
| Example 3 | Copper | S510 | Marginal | Marginal | Poor | — | — |
| Example 4 | Copper | S530 | Marginal | Marginal | Poor | — | — |
| Example 5 | Aluminum | KBM-903 | Excellent | Excellent | Excellent | Excellent | Poor |
| Example 6 | Aluminum | S320 | Excellent | Excellent | Poor | — | — |
| Example 7 | Aluminum | S510 | Marginal | Marginal | Poor | — | — |
| Example 8 | Aluminum | S530 | Excellent | Marginal | Poor | — | — |
| Example 9 | Nickel | KBM-903 | Excellent | Excellent | Excellent | Poor | — |
| Example 10 | Nickel | S320 | Excellent | Marginal | Poor | — | — |
| Example 11 | Nickel | S510 | Marginal | Marginal | Poor | — | — |
| Example 12 | Nickel | S530 | Marginal | Marginal | Poor | — | — |
| Comparative Example 1 | Copper | None, laminated and pressed | Poor | — | — | — | — |
| Comparative Example 2 | Copper | DDM + jER807 | Excellent | Poor | — | — | — |
| Comparative Example 3 | Aluminum | None, laminated and pressed | Poor | — | — | — | — |
| Comparative Example 4 | Aluminum | DDM + jER807 | Poor | — | — | — | — |
| Comparative Example 5 | Nickel | None, laminated and pressed | Poor | — | — | — | — |
| Comparative Example 6 | Nickel | DDM + jER807 | Excellent | Poor | — | — | — |

As shown in Table 1, the laminates prepared by applying silane coupling agent treatment onto the surface of copper foil, aluminum foil or nickel foil had high adhesiveness. In particular, adhesiveness when the silane coupling agent having the amino group was excellent. Next, adhesiveness when the oxiranyl-based silane coupling agent was used was good.

In comparison with the above-described results, in the laminate obtained by applying the mixture of the polymerizable oxiranyl compound: jER 807 (made by Mitsubishi Chemical Corporation) and the amine-based curing agent (DDM): 4,4'-diamino-1,2-diphenylmethane (made by FUJI-FILM Wako Pure Chemical Corporation), which is a mixed oxiranyl-based and amine-based adhesive, adhesiveness was less than 5.0 N/20 mm, and the laminate prepared by applying silane coupling agent treatment was superior in adhesiveness.

All the documents including a publication, a patent application and a patent quoted herein are herein referred to and incorporated at the same degree as showing, referring to and incorporating each document individually specifically, and describing all the contents herein.

Use of a noun and a similar reference term to be used with regard to description of the invention (with regard to particularly the following claims) is construed to be performed in both a singular number and a plural number unless the use is particularly pointed out herein or clearly contradicts a context. Unless otherwise noted, expressions "equip," "have," "include" and "contain" are construed as open-ended terms (more specifically, meaning of "include, but not limited to"). Unless particularly pointed out herein, specification of the range of a numerical value herein has intention of simply playing a role as an abridged notation for individually referring to each value applicable in the range thereof, and each value is incorporated herein as if the value is individually listed herein. All the methods described herein can be performed in every suitable order unless the methods are particularly pointed out herein or clearly contradicts a context. Unless particularly claimed, every example or expression in exemplification used herein (for example, "or the like") has intention of simply better describing the invention, and is not limited to the scope of the invention. Any expression herein is not construed to be an expression that is absolutely necessary to practice of the invention and represents an element that is not described in claims.

Herein, preferred embodiments of the invention are described including a best embodiment that is known by the present inventors for practicing the invention. Deformation of the preferred embodiments will become clear for a person skilled in the art after the person reads the description described above. The inventor expects that a skilled person appropriately applies such deformation, and the inventor expects that the invention is practiced by a method other than a method specifically described herein. Accordingly, as allowed in an applicable law, the invention includes all the modifications of and equivalents to contents according to claims attached hereto. Furthermore, any combination of the elements described above in all deformation is contained by the invention unless the combination is particularly pointed out herein or clearly contradicts a context.

What is claimed is:

1. A laminate, comprising:
   a thermally conductive first inorganic filler bonded with one end of a first coupling agent;
   a thermally conductive second inorganic filler bonded with one end of a second coupling agent, in which a bifunctional or higher functional polymerizable liquid crystal compound is further bonded with the other end of the second coupling agent, a filler bonded with at least one functional group of the polymerizable liquid crystal compound in the other end of the first coupling agent; and
   a metal layer bonded with one end of a third coupling agent,
   wherein the other end of the third coupling agent is bonded with the other end of the first coupling agent.

2. The laminate according to claim 1, wherein the first coupling agent, the second coupling agent or the third coupling agent is a silane coupling agent having basicity.

3. The laminate according to claim 2, wherein the first coupling agent, the second coupling agent or the third coupling agents is a silane coupling agent having an amino group, an oxiranyl group or an oxetanyl group.

4. The laminate according to claim 1, further comprising a thermally conductive fourth inorganic filler.

5. The laminate according to claim 4, wherein the first inorganic filler, the second inorganic filler or the fourth inorganic filler each is at least one selected from boron nitride, boron carbide, carbon boron nitride, graphite, a carbon fiber, a carbon nanotube, graphene, alumina, aluminum nitride, silica, silicon nitride, silicon carbide, zinc oxide, magnesium oxide, magnesium hydroxide, cordierite or an iron oxide-based material.

6. The laminate according to claim 1, wherein each layer and the next layer in the laminate are laminated in a thickness direction or in a horizontal direction.

7. A laminate, comprising:
a thermally conductive second inorganic filler bonded with one end of a second coupling agent, in which a bifunctional or higher functional polymerizable liquid crystal compound is further bonded with the other end of the second coupling agent; a metal layer bonded with one end of a third coupling agent; and
a filler directly bonded at least one functional group of the bifunctional or higher functional polymerizable liquid crystal compound with one end of a first coupling agent, in which the other end of the first coupling agent is further bonded with a thermally conductive first inorganic filler,
wherein the other end of the third coupling agent is bonded with at least one functional group of the bifunctional or higher functional polymerizable liquid crystal compound.

8. The laminate according to claim 7, wherein the first coupling agent, the second coupling agent or the third coupling agent is a silane coupling agent having basicity.

9. The laminate according to claim 8, wherein the first coupling agent, the second coupling agent or the third coupling agents is a silane coupling agent having an amino group, an oxiranyl group or an oxetanyl group.

10. The laminate according to claim 7, further comprising a thermally conductive fourth inorganic filler.

11. The laminate according to claim 10, wherein the first inorganic filler, the second inorganic filler or the fourth inorganic filler each is at least one selected from boron nitride, boron carbide, carbon boron nitride, graphite, a carbon fiber, a carbon nanotube, graphene, alumina, aluminum nitride, silica, silicon nitride, silicon carbide, zinc oxide, magnesium oxide, magnesium hydroxide, cordierite or an iron oxide-based material.

12. The laminate according to claim 7, wherein each layer and the next layer in the laminate are laminated in a thickness direction or in a horizontal direction.

13. A laminate, comprising:
a thermally conductive third inorganic filler having a functional group on a surface;
a thermally conductive first inorganic filler bonded with one end of a first coupling agent; and a thermally conductive second inorganic filler bonded with one end of a second coupling agent, in which a bifunctional or higher functional polymerizable liquid crystal compound is further bonded with the other end of the second coupling agent, a filler bonded with at least one functional group of the polymerizable liquid crystal compound in the other end of the first coupling agent; and
a metal layer bonded with one end of a third coupling agent,
wherein the other end of the third coupling agent is bonded with the functional group of the third inorganic filler.

14. The laminate according to claim 13, wherein the first coupling agent, the second coupling agent or the third coupling agent is a silane coupling agent having basicity.

15. The laminate according to claim 14, wherein the first coupling agent, the second coupling agent or the third coupling agents is a silane coupling agent having an amino group, an oxiranyl group or an oxetanyl group.

16. The laminate according to claim 13, further comprising a thermally conductive fourth inorganic filler.

17. The laminate according to claim 16, wherein the first inorganic filler, the second inorganic filler, the third inorganic filler or the fourth inorganic filler each is at least one selected from boron nitride, boron carbide, carbon boron nitride, graphite, a carbon fiber, a carbon nanotube, graphene, alumina, aluminum nitride, silica, silicon nitride, silicon carbide, zinc oxide, magnesium oxide, magnesium hydroxide, cordierite or an iron oxide-based material.

18. The laminate according to claim 13, wherein each layer and the next layer in the laminate are laminated in a thickness direction or in a horizontal direction.

19. Electronic equipment, comprising:
the laminate according to claim 1; and
an electronic device having a heat generation unit,
wherein the laminate is arranged to the electronic device so as to be in contact with the heat generation unit.

20. A production method for a laminate, comprising:
a step of bonding a thermally conductive first inorganic filler with one end of a first coupling agent;
a step of bonding a thermally conductive second inorganic filler with one end of a second coupling agent, in which a bifunctional or higher functional polymerizable liquid crystal compound is further bonded with the other end of the second coupling agent, a filler bonded with at least one functional group of the polymerizable liquid crystal compound in the other end of the first coupling agent;
a step of bonding a metal layer with one end of a third coupling agent; and
a step of bonding the other end of the third coupling agent with the other end of the first coupling agent.

21. A production method for a laminate, comprising:
a step of bonding a thermally conductive second inorganic filler with one end of a second coupling agent;
a step of bonding the other end of the second coupling agent with a bifunctional or higher functional polymerizable liquid crystal compound;
a step of bonding a metal layer with one end of a third coupling agent; a step of bonding the other end of the third coupling agent with at least one functional group of the bifunctional or higher functional polymerizable liquid crystal compound; and
a step of directly bonding at least one functional group of the bifunctional or higher functional polymerizable liquid crystal compound with one end of a first coupling agent, in which the other end of the first coupling agent is further bonded with a thermally conductive first inorganic filler.

22. A production method for a laminate, comprising:
a step of bonding a metal layer with one end of a third coupling agent;
a step of bonding a thermally conductive first inorganic filler with one end of a first coupling agent; and a step of bonding a thermally conductive second inorganic filler bonded with one end of a second coupling agent, in which a bifunctional or higher functional polymerizable liquid crystal compound is further bonded with the other end of the second coupling agent, a filler bonded with at least one functional group of the polymerizable liquid crystal compound in the other end of the first coupling agent; and
a step of bonding the other end of the third coupling agent with a functional group of a thermally conductive third inorganic filler having the functional group on a surface.

23. Electronic equipment, comprising:
the laminate according to claim 7; and
an electronic device having a heat generation unit,
wherein the laminate is arranged to the electronic device so as to be in contact with the heat generation unit.

24. Electronic equipment, comprising:
the laminate according to claim 13; and
an electronic device having a heat generation unit,
wherein the laminate is arranged to the electronic device so as to be in contact with the heat generation unit.

* * * * *